United States Patent
Harada et al.

(10) Patent No.: US 11,925,013 B2
(45) Date of Patent: Mar. 5, 2024

(54) MEMORY DEVICE USING PILLAR-SHAPED SEMICONDUCTOR ELEMENT

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 134 days.

(21) Appl. No.: 17/735,414

(22) Filed: May 3, 2022

(65) Prior Publication Data
US 2022/0359520 A1 Nov. 10, 2022

(30) Foreign Application Priority Data

May 7, 2021 (WO) ............... PCT/JP2021/017504

(51) Int. Cl.
*H10B 12/00* (2023.01)
*G11C 11/404* (2006.01)
(Continued)

(52) U.S. Cl.
CPC ............ *H10B 12/20* (2023.02); *G11C 11/404* (2013.01); *G11C 11/4096* (2013.01); *G11C 11/412* (2013.01)

(58) Field of Classification Search
CPC ... H10B 12/20; G11C 11/404; G11C 11/4096; G11C 11/412; G11C 2211/4016;
(Continued)

(56) References Cited

U.S. PATENT DOCUMENTS 10,672,794 B2* 6/2020 Kono ................... G11C 5/025
2003/0111681 A1 6/2003 Kawanaka
(Continued)

FOREIGN PATENT DOCUMENTS

JP H 02-188966 A 7/1990
JP H 03-171768 A 7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Donald H B Braswell
(74) *Attorney, Agent, or Firm* — Crowell & Moring LLP

(57) ABSTRACT

Si pillars 22a to 22d stand on an N⁺ layer 21 connected to a source line SL. Lower portions of the Si pillars 22a to 22d are surrounded by a HfO₂ layer 25a, which is surrounded by TiN layers 26a and 26b that are respectively connected to plate lines PL1 and PL2 and are isolated from each other. Upper portions of the Si pillars 22a to 22d are surrounded by a HfO₂ layer 25b, which is surrounded by TiN layers 28a and 28b that are respectively connected to word lines WL1 and WL2 and are isolated from each other. A thickness Lg1 of the TiN layer 26a on a line X-X' is smaller than twice a thickness Lg2 of the TiN layer 26a on a line Y-Y' and is larger than or equal to the thickness Lg2. The thickness Lg1 of the TiN layer 28a on the line X-X' is smaller than twice the thickness Lg2 of the TiN layer 28a on the line Y-Y'.

7 Claims, 12 Drawing Sheets

(51) Int. Cl.
*G11C 11/4096* (2006.01)
*G11C 11/412* (2006.01)

(58) Field of Classification Search
CPC ... G11C 7/02; G11C 11/4094; G11C 11/4097; G11C 5/025
See application file for complete search history.

(56) References Cited

U.S. PATENT DOCUMENTS

| | | |
|---|---|---|
| 2008/0137394 A1 | 6/2008 | Shimano |
| 2008/0251825 A1* | 10/2008 | Lee .................. H01L 29/42392 257/E29.264 |
| 2009/0189222 A1 | 7/2009 | Shino |
| 2010/0142294 A1* | 6/2010 | Carman ................ H10B 12/20 257/329 |
| 2014/0048860 A1* | 2/2014 | Mikasa ................ H10B 12/053 257/296 |
| 2020/0066861 A1 | 2/2020 | Goto |
| 2023/0110504 A1* | 4/2023 | Zhu .................. H01L 29/78642 257/295 |

FOREIGN PATENT DOCUMENTS

| | | |
|---|---|---|
| JP | 3957774 B2 | 8/2007 |
| JP | 2009-177080 A | 8/2009 |
| JP | 2020-031197 A | 2/2020 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).
Initial Patent Examination Report (PCT/IPEA/409) (Japanese) from PCT/JP2021/017504 dated Apr. 14, 2022, 5 pgs.
F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief descri9tion attached.

* cited by examiner

FIG.2A "1" WRITE STATE
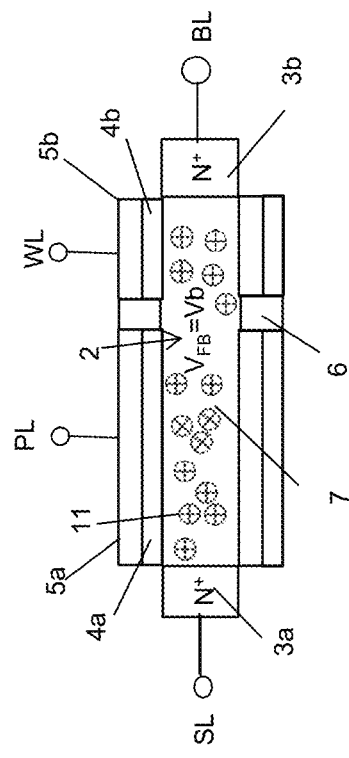
FIG.2B "0" ERASE OPERATION
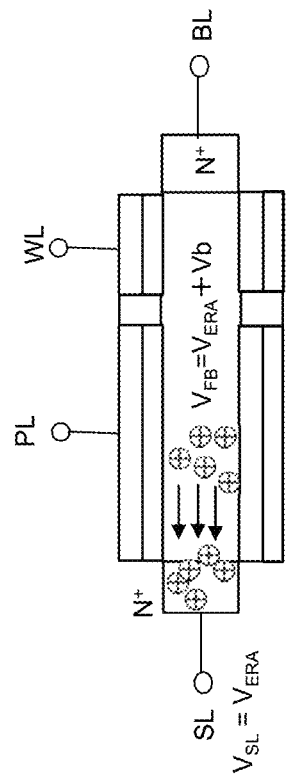
Vb: BUILT-IN VOLTAGE TO 0.7V
FIG.2C
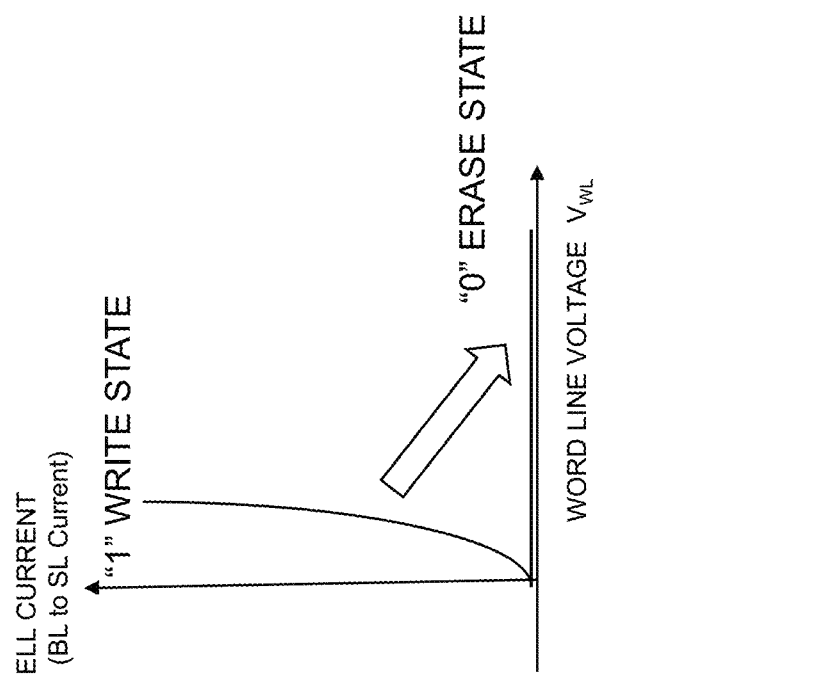

"1" WRITE OPERATION
SOURCE-SIDE IMPACT IONIZATION

"1" WRITE STATE

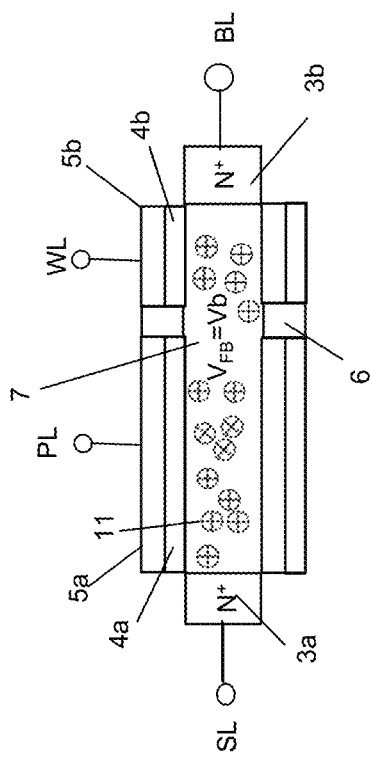
FIG.4AA "1" WRITE STATE
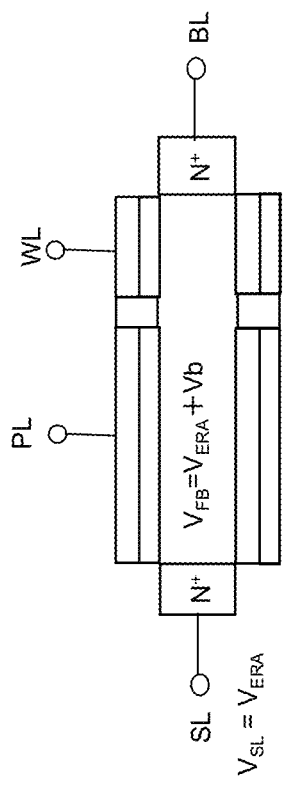
FIG.4AB "0" ERASE STATE
Vb: BUILT-IN VOLTAGE TO 0.7V
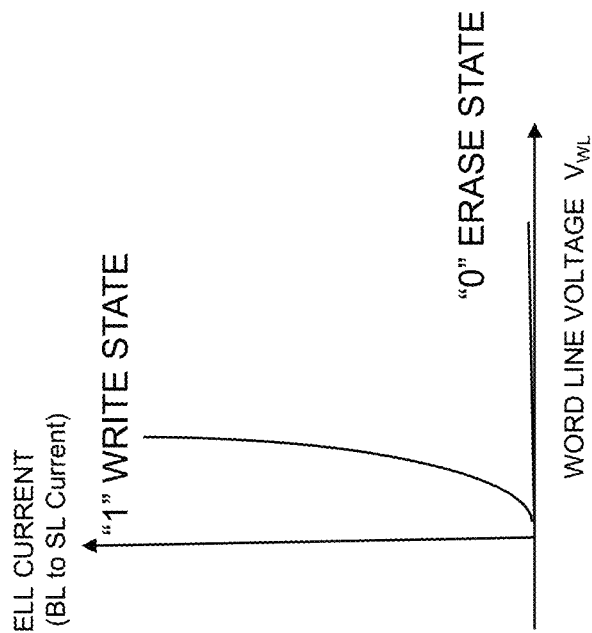
FIG.4AC

BL: BIT LINE
SL: SOURCE LINE
WL: WORD LINE
PL: PLATE LINE
FB: FLOATING BODY $$C_{FB} = C_{PL} + C_{WL} + C_{BL} + C_{SL}$$

$$\Delta V_{FB} = V_{FB2} - V_{FB1}$$
$$= \frac{C_{WL}}{C_{PL} + C_{WL} + C_{BL} + C_{SL}} \times V_{ReadWL} \quad (1)$$

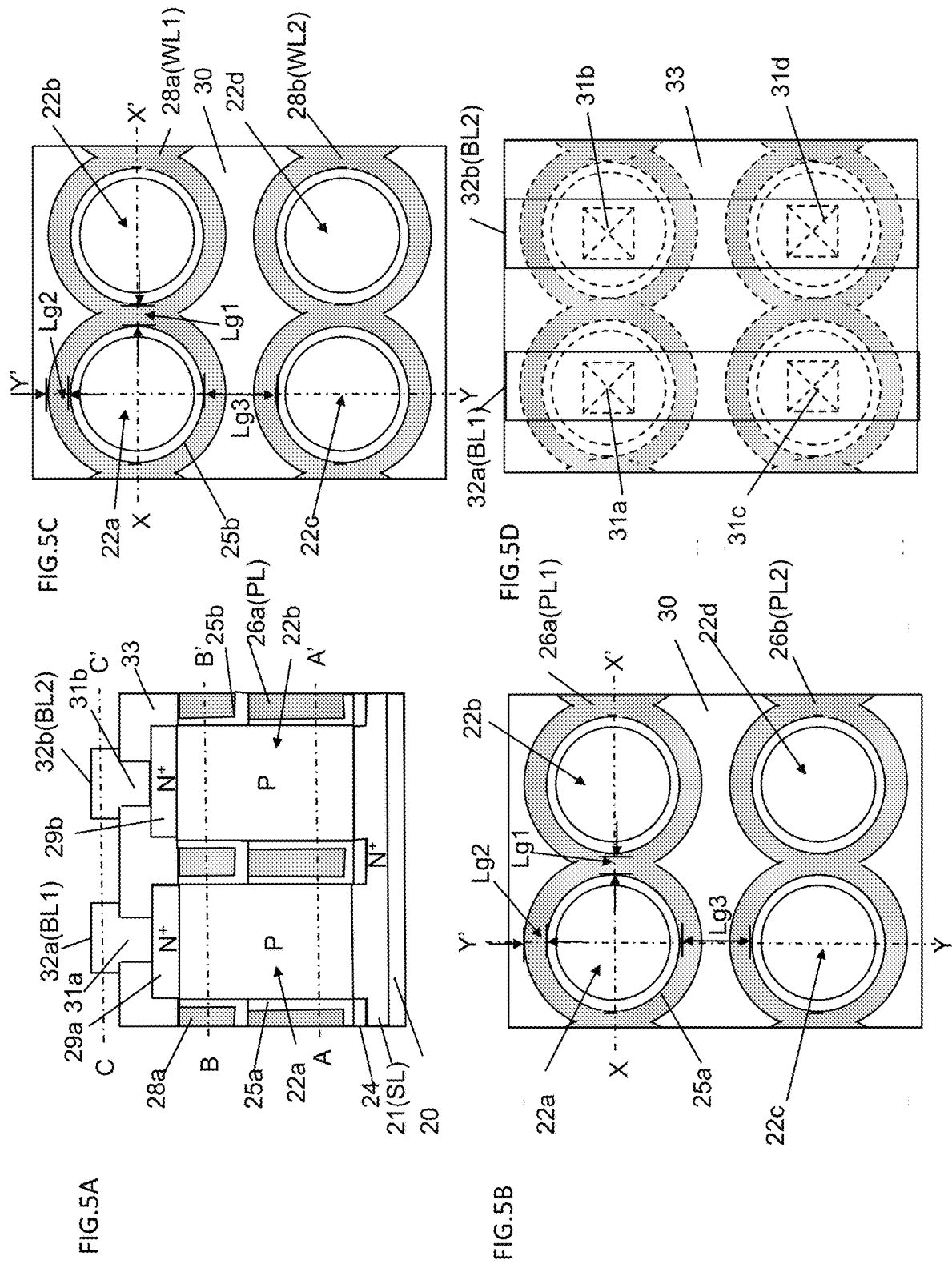

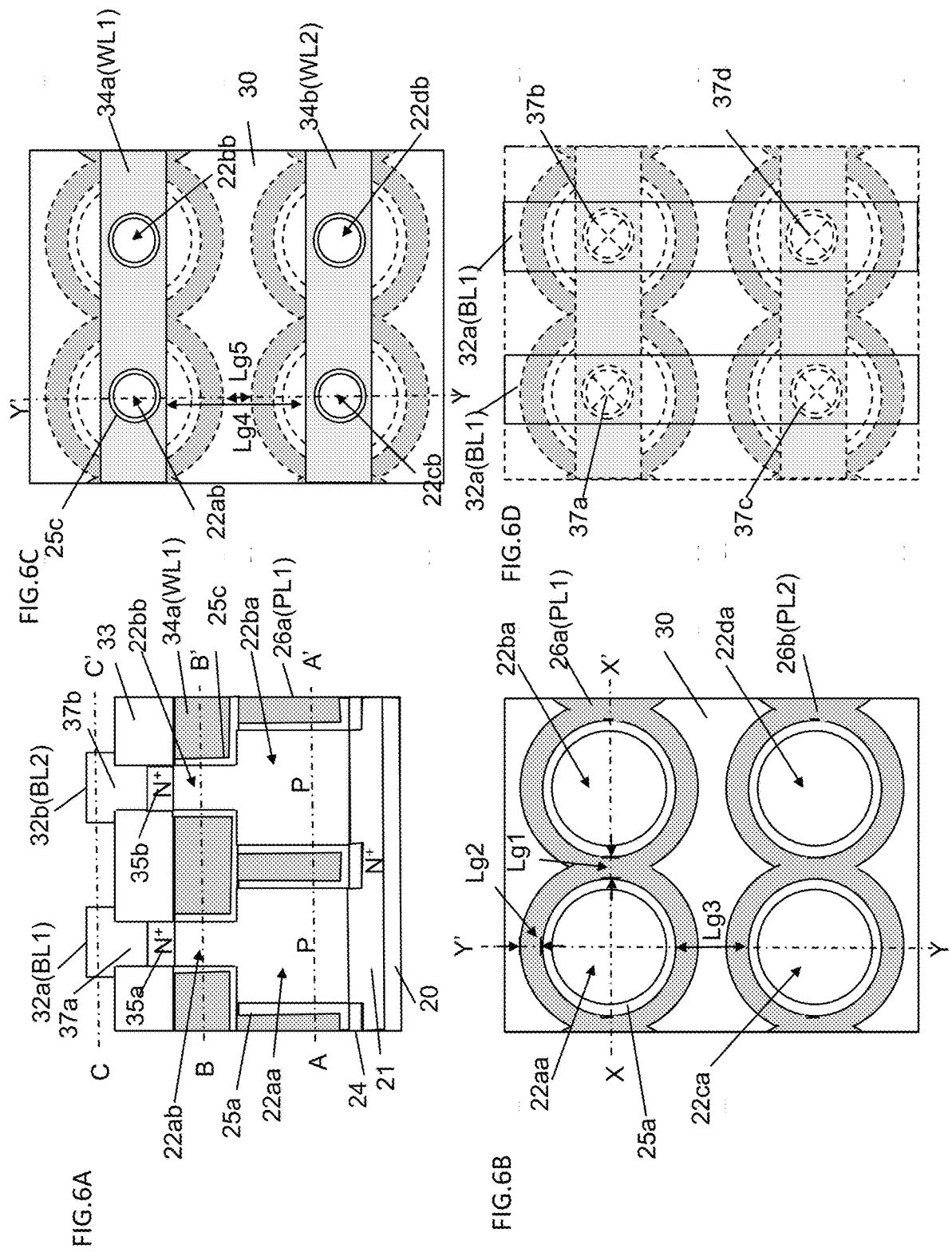

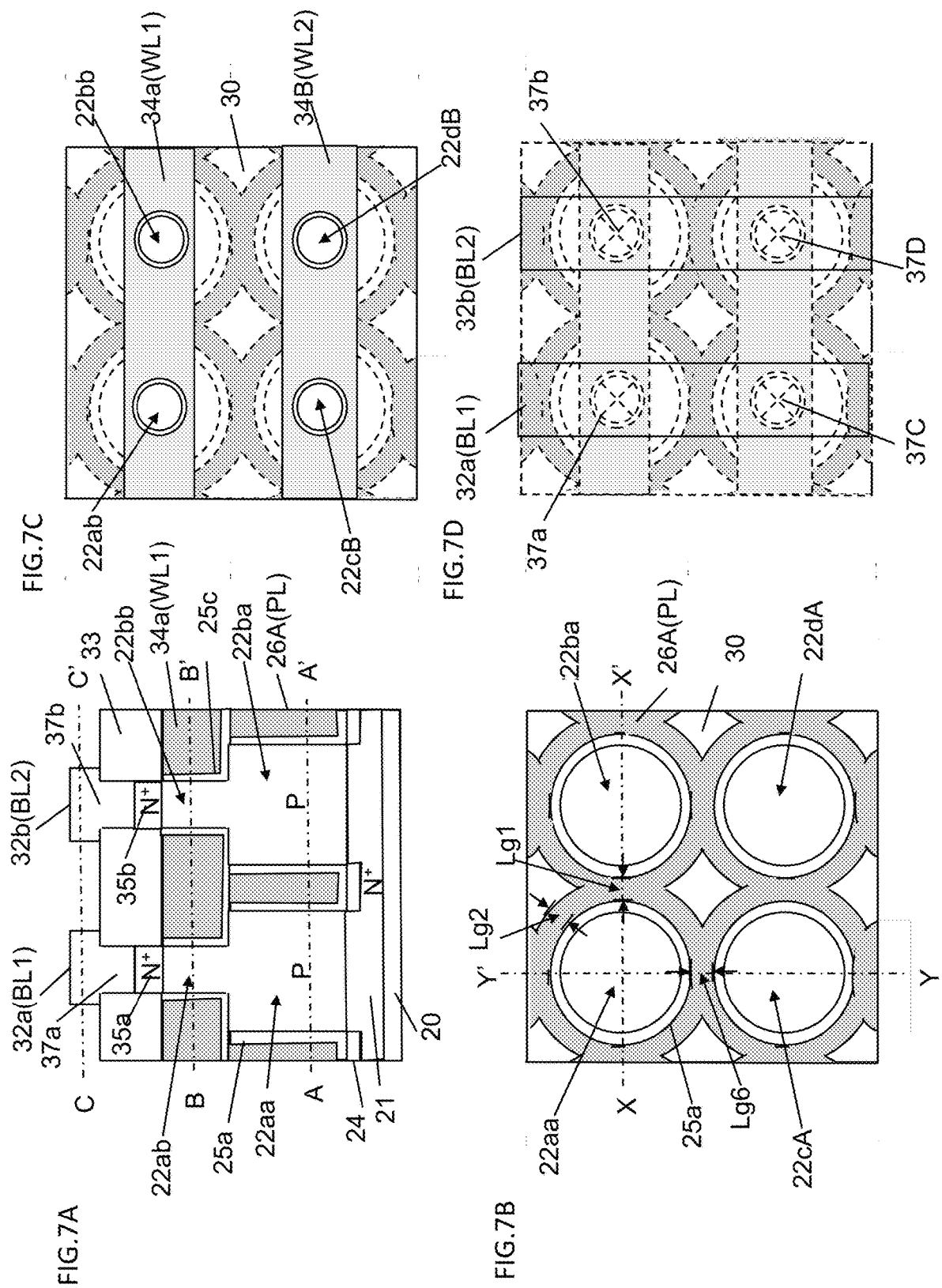

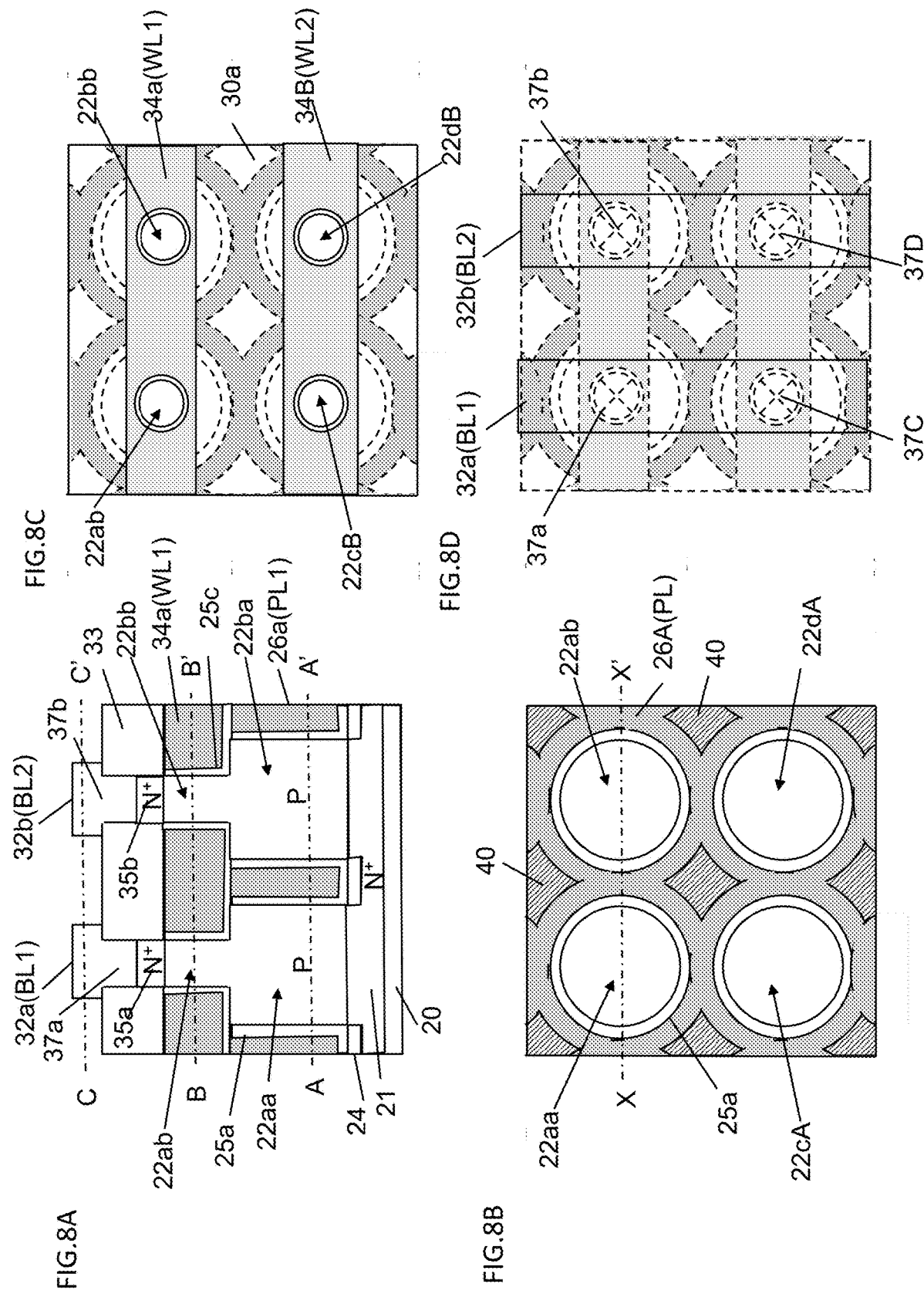

$$\Delta V_{FB} = V_{FB2} - V_{FB1}$$

$$= \frac{C_{WL}}{C_{WL} + C_{BL} + C_{SL}} \times V_{ProgWL} \quad (2)$$

$$\beta = \frac{C_{WL}}{C_{WL} + C_{BL} + C_{SL}} \quad (3)$$

$$C_{FB} = C_{WL} + C_{BL} + C_{SL} \quad (1)$$

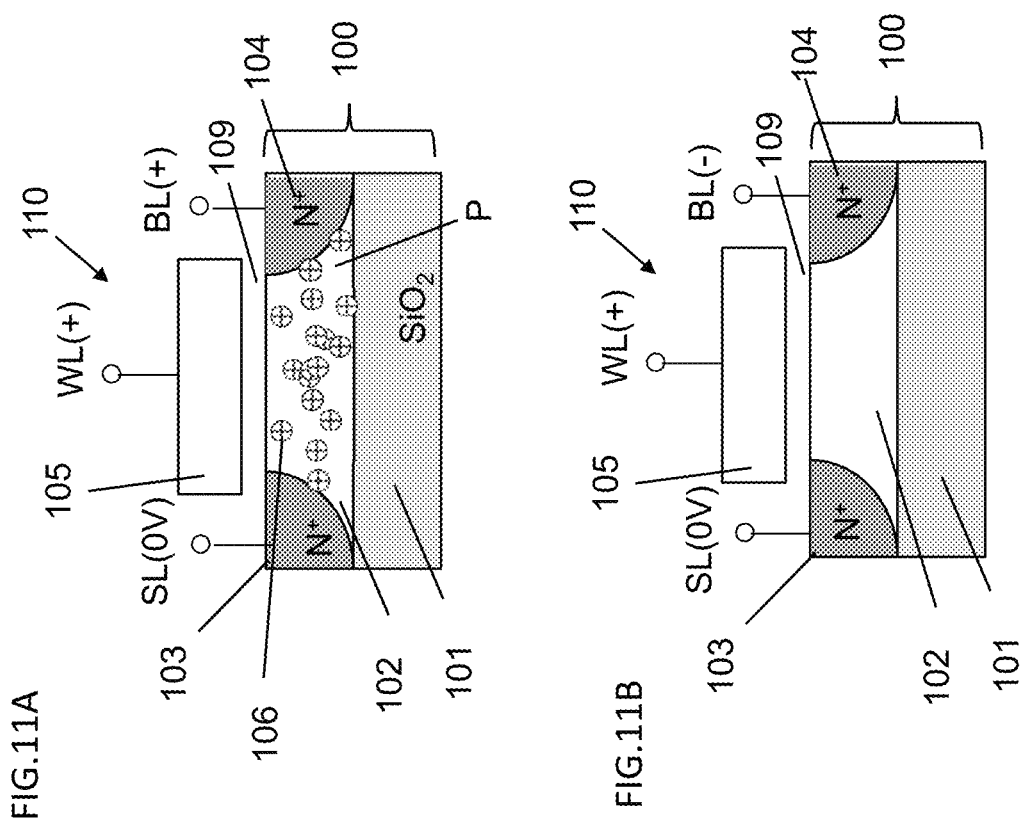

MEMORY DEVICE USING PILLAR-SHAPED SEMICONDUCTOR ELEMENT

CROSS-REFERENCE TO RELATED APPLICATIONS

This application claims priority to PCT/JP2021/017504 filed May 7, 2021, the enter content of which is incorporated herein by reference.

TECHNICAL FIELD

The present invention relates to A memory device using a pillar-shaped semiconductor element.

BACKGROUND ART

In recent years, there has been a desire for a higher degree of integration and a higher performance of semiconductor-element-including memory devices in the development of LSI (Large Scale Integration) technology.

In typical planar MOS transistors, a channel extends in a horizontal direction along an upper surface of a semiconductor substrate. By contrast, in SGTs, a channel extends in a direction perpendicular to an upper surface of a semiconductor substrate (see, for example, PTL 1 and NPL 1). Thus, SGTs can achieve a higher density of semiconductor devices than planar MOS transistors. With the use of such SGTs as selection transistors, a higher degree of integration can be achieved in memory devices such as a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), and an MRAM (Magneto-resistive Random Access Memory, see, for example, NPL 5) in which the direction of a magnetic spin is changed with a current to change the resistance. There is also a capacitorless DRAM memory cell (see NPL 6) constituted by a single MOS transistor. The present application relates to a dynamic-flash-memory-including semiconductor device that can be constituted only by a MOS transistor without any resistance change element or any capacitor.

FIGS. 9A to 9D illustrate a write operation of the aforementioned capacitorless DRAM memory cell constituted by a single MOS transistor, FIGS. 10A and 10B illustrate an issue in the operation of the DRAM memory cell, and FIGS. 11A to 11C illustrate a read operation of the DRAM memory cell (see NPLs 6 to 10).

FIGS. 9A to 9D illustrate a write operation of the DRAM memory cell. FIG. 9A illustrates a "1" write state. The memory cell is constituted by a source N$^+$ layer 103 (hereinafter, a semiconductor region that contains a donor impurity at a high concentration is referred to as an "N$^+$ layer") which is formed in an SOI substrate 100 and to which a source line SL is connected, a drain N$^+$ layer 104 which is formed in the SOI substrate 100 and to which a bit line BL is connected, a gate conductive layer 105 to which a word line WL is connected, and a floating body 102 of a MOS transistor 110a. In this manner, the DRAM memory cell is constituted by the single MOS transistor 110a without any capacitor. A SiO$_2$ layer 101 of the SOI substrate 100 is in contact with the floating body 102 immediately under the floating body 102. When "1" is written in this memory cell constituted by the single MOS transistor 110a, the MOS transistor 110a is operated in a saturated region. Specifically, a channel 107 for electrons extending from the source N$^+$ layer 103 has a pinch-off point 108 and does not reach the drain N$^+$ layer 104 to which the bit line BL is connected. When a high voltage is applied to both the bit line BL connected to the drain N$^+$ layer 104 and the word line WL connected to the gate conductive layer 105 and the MOS transistor 110a is operated at a gate voltage that is about ½ of the drain voltage, the electric field intensity is maximized at the pinch-off point 108 near the drain N$^+$ layer 104. As a result, the accelerated electrons flowing from the source N$^+$ layer 103 toward the drain N$^+$ layer 104 collide with the Si lattice, and electron-positive hole pairs are generated by kinetic energy lost at the time of collision (impact ionization phenomenon). Most of the generated electrons (not illustrated) reach the drain N$^+$ layer 104. Only a small number of very hot electrons jump over a gate oxide film 109 to reach the gate conductive layer 105. The floating body 102 is charged with positive holes 106 simultaneously generated. In this case, since the floating body 102 is made of P-type Si, the generated positive holes 106 contribute to an increment of the majority carrier. The floating body 102 is filled with the generated positive holes 106, and when the voltage of the floating body 102 becomes higher than that of the source N$^+$ layer 103 by Vb or more, the further generated positive holes are discharged to the source N$^+$ layer 103. Vb is a built-in voltage of a PN junction between the source N$^+$ layer 103 and the P-layer floating body 102, and is equal to about 0.7 V. FIG. 9B illustrates a state in which the floating body 102 is charged to be saturated with the generated positive holes 106.

Now, a "0" write operation of the memory cell 110 will be described with reference to FIG. 9C. A memory cell 110a in which "1" is written and the memory cell 110b in which "0" is written are present at random for the common selection word line WL. FIG. 9C illustrates a state of rewriting from the "1" write state to a "0" write state. When "0" is written, the voltage of the bit line BL is set to a negative bias, so that the PN junction between the drain N$^+$ layer 104 and the P-layer floating body 102 is forward biased. As a result, the positive holes 106 generated in the floating body 102 in the previous cycle flow into the drain N$^+$ layer 104 connected to the bit line BL. At the end of the write operation, two memory cell states, i.e., the memory cell 110a filled with the generated positive holes 106 (FIG. 9B)) and the memory cell 110b from which the generated positive holes 106 are discharged (FIG. 9C), are obtained. The potential of the floating body 102 of the memory cell 110a filled with the positive holes 106 is higher than the potential of the floating body 102 without any generated positive holes 106. Thus, a threshold voltage of the memory cell 110a is lower than a threshold voltage of the memory cell 110b. FIG. 9D illustrates this state.

Now, an issue in the operation of this memory cell constituted by a single MOS transistor will be described with reference to FIGS. 10A and 10B. As illustrated in FIG. 10A, a capacitance $C_{FB}$ of the floating body 102 is equal to the sum of a capacitance $C_{WL}$ between the gate to which the word line WL is connected and the floating body 102, a junction capacitance $C_{SL}$ of the PN junction between the source N$^+$ layer 103 to which the source line SL is connected and the floating body 102, and a junction capacitance $C_{BL}$ of the PN junction between the drain N$^+$ layer 103 to which the bit line BL is connected and the floating body 102, and is denoted by $$C_{FB}=C_{WL}+C_{BL}+C_{SL} \qquad (1).$$

Thus, if a word line voltage $V_{WL}$ fluctuates at the time of writing, the voltage of the floating body 102 that serves as a storage node (contact point) of the memory cell is also affected by the fluctuation. FIG. 10B illustrates this state. If the word line voltage $V_{WL}$ rises from 0 V to $V_{ProgWL}$ at the time of writing, the voltage $V_{FB}$ of the floating body 102 also rises from $V_{FB1}$, which is a voltage in the initial state before the word line voltage $V_{WL}$ changes, to $V_{FB2}$ due to capacitive coupling with the word line WL. An amount of the voltage change $\Delta V_{FB}$ is denoted by $$\Delta V_{FB} = V_{FB2} - V_{FB1} = C_{WL}/(C_{WL} + C_{BL} + C_{SL}) \times V_{ProgWL}. \quad (2)$$

Here, $\beta$ is denoted by $$\beta = C_{WL}/(C_{WL} + C_{BL} + C_{SL}) \quad (3)$$

and is referred to as a coupling ratio. In such a memory cell, the contribution ratio of $C_{WL}$ is large. For example, $C_{WL}$:$C_{BL}$:$C_{SL}$=8:1:1 holds. In this case, $\beta$=0.8 holds. For example, if the voltage of the word line WL changes from 5 V at the time of writing to 0 V after the end of writing, the floating body 102 is subjected to fluctuation noise of as large as 5 V×$\beta$=4 V due to the capacitive coupling between the word line WL and the floating body 102. Thus, there is an issue in that a sufficient margin of the potential difference between the "1" potential and the "0" potential of the floating body at the time of writing is not provided.

FIGS. 11A to 11C illustrate a read operation. FIG. 11A illustrates the "1" write state, and FIG. 11B illustrates the "0" write state. However, even when Vb is written in the floating body 102 in writing of "1", when the voltage of the word line WL returns to 0 V upon the completion of the writing, the voltage of the floating body 102 lowers to a negative bias in reality. When "0" is written, the voltage of the floating body 102 further lowers to a negative bias. Thus, a sufficiently large margin of the potential difference between "1" and "0" is not provided at the time of writing. This small operation margin is a big issue for the DRAM memory cell. How a peripheral circuit for driving the DRAM memory cell is formed on the same substrate is also an issue.

CITATION LIST

Patent Literature

[PTL 1] Japanese Unexamined Patent Application Publication No. 2-188966
[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)
[NPL 7] J. Wan, L. Rojer, A. Zaslaysky, and S. Critoloveanu: "A Compact Capacitor-Less High-Speed DRAM Using Field Effect-Controlled Charge Regeneration", Electron Device Letters, Vol. 35, No. 2, pp. 179-181 (2012)
[NPL 8] T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002).
[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006).
[NPL 10] E. Yoshida, T. Tanaka: "A Design of a Capacitorless 1T-DRAM Cell Using Gate-induced Drain Leakage (GIDL) Current for Low-power and High-speed Embedded Memory", IEEE IEDM (2003).
[NPL 11] E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-697, April 2006.

SUMMARY OF INVENTION

Technical Problem

In a capacitorless single-transistor DRAM (gain cell) that is a memory device using an SGT, the capacitive coupling between a word line and a floating SGT body is large. Thus, the capacitorless single-transistor DRAM (gain cell) has an issue in that when the potential of the word line is fluctuated at the time of data reading or data writing, the fluctuation of the potential is directly transmitted as noise to the SGT body. This consequently causes an issue of erroneous reading and erroneous rewriting of stored data and makes it difficult to put the capacitorless single-transistor DRAM (gain cell) into practical use. Thus, it is necessary to cope with the issues described above and to form a memory device with a higher density.

Solution to Problem

To cope with the issues described above, a memory device, using a pillar-shaped semiconductor element, according to the present invention includes
a first semiconductor pillar, a second semiconductor pillar, a third semiconductor pillar, and a fourth semiconductor pillar, the first semiconductor pillar and the second semiconductor pillar standing on a substrate in a vertical direction, having respective center points on a first line, and being adjacent to each other in plan view, the third semiconductor pillar and the fourth semiconductor pillar standing on the substrate in the vertical direction, having respective center points on a second line parallel to the first line in plan view, and being adjacent to each other;

a first impurity region connected to bottom portions of the first to fourth semiconductor pillars;

first gate insulating layers located above the first impurity region in the vertical direction and each surrounding a lower portion of a corresponding one of the first to fourth semiconductor pillars;

first gate conductor layers and second gate conductor layers surrounding the respective first gate insulating layers, the first gate conductor layers being continuous around the first semiconductor pillar and the second semiconductor pillar, the second gate conductor layers being continuous around the third semiconductor pillar and the fourth semiconductor pillar;

second gate insulating layers located above the respective first gate insulating layers and each surrounding a side surface of a corresponding one of the first to fourth semiconductor pillars;

third gate conductor layers and fourth gate conductor layers surrounding the respective second gate insulating layers, each having an upper surface located below top portions of the first to fourth semiconductor pillars in the vertical direction, and each being apart from the first gate conductor layers and the second gate conductor layers in the vertical direction, the third gate conductor layers being continuous around the first semiconductor pillar and the second semiconductor pillar, the fourth gate conductor layers being continuous around the third semiconductor pillar and the fourth semiconductor pillar;

second impurity regions at the respective top portions of the first to fourth semiconductor pillars;

a first wiring conductor layer connected to the second impurity regions at the respective top portions of the first semiconductor pillar and the third semiconductor pillar; and a second wiring conductor layer connected to the second impurity region regions at the respective top portions of the second semiconductor pillar and the fourth semiconductor pillar, in which the first gate conductor layer of the first semiconductor pillar and the first gate conductor layer of the second semiconductor pillar are in contact with each other, and the first gate conductor layer of the third semiconductor pillar and the first gate conductor layer of the fourth semiconductor pillar are in contact with each other, in plan view, a first length between two opposing intersections among intersections between the first line and two outer periphery edges of the first gate insulating layers surrounding the first semiconductor pillar and the second semiconductor pillar is smaller than twice a second length that is a thickness of a portion of each of the first gate conductor layers that is not in contact with the other first gate conductor layers, voltages to be applied to the first gate conductor layers, the second gate conductor layers, the third gate conductor layers, the fourth gate conductor layers, the first impurity region, and the second impurity region regions are controlled to perform a data write operation for holding a group of positive holes generated by an impact ionization phenomenon or a gate-induced drain leakage current in any or all of the first to fourth semiconductor pillars, and the voltages to be applied to the first gate conductor layers, the second gate conductor layers, the third gate conductor layers, the fourth gate conductor layers, the first impurity region, and the second impurity region regions are controlled to perform a data write operation, a data erase operation, and a data read operation.

First Aspect of the Invention

In the first aspect of the invention described above, in plan view, a third length between two opposing intersections among intersections between two outer periphery edges of the first gate insulating layers surrounding the first semiconductor pillar and the third semiconductor pillar and a third line that is orthogonal to the first line and passes through the center points of the first semiconductor pillar and the third semiconductor pillar is larger than twice the second length Second Aspect of the Invention In the first aspect of the invention described above, in plan view, a third length between two opposing intersections among intersections between two outer periphery edges of the first gate insulating layers surrounding the first semiconductor pillar and the third semiconductor pillar and a third line that is orthogonal to the first line and passes through the center points of the first semiconductor pillar and the third semiconductor pillar is smaller than twice the second length Third Aspect of the Invention In the first aspect of the invention described above, in plan view, a first outer periphery edge of a portion of each of the first to fourth semiconductor pillars surrounded by the respective second gate insulating layers is on inner side of a second outer periphery edge of a portion of a corresponding one of the first to fourth semiconductor pillars surrounded by the respective first gate insulating layers, and in plan view, a fourth length between the third gate conductor layers surrounding the first semiconductor pillar and the second semiconductor pillar and the respective fourth gate conductor layers surrounding the third semiconductor pillar and the fourth semiconductor pillar is larger than a fifth length between the first gate conductor layers surrounding the first semiconductor pillar and the third semiconductor pillar and the respective second gate conductor layers Fourth Aspect of the Invention In the first aspect of the invention described above, the memory device, using a pillar-shaped semiconductor element, includes a first conductor layer formed of a single layer or a plurality of layers and covering an outer surface of the first gate conductor layers in plan view Fifth Aspect of the Invention In the first aspect of the invention described above, the voltages to be applied to the first gate conductor layers, the second gate conductor layers, the third gate conductor layers, the fourth gate conductor layers, the first impurity region, and the second impurity region regions are controlled to perform the data write operation for holding a group of positive holes generated by an impact ionization phenomenon or a gate-induced drain leakage current in any or all of the first to fourth semiconductor pillars, and the voltages to be applied to the first gate conductor layers, the second gate conductor layers, the third gate conductor layers, the fourth gate conductor layers, the first impurity region, and the second impurity region regions are controlled to perform the data erase operation for discharging the group of positive holes from inside of any or all of the first to fourth semiconductor pillars Sixth Aspect of the Invention In the first aspect of the invention described above, a first gate capacitance between each of the first gate conductor layers or each of the second gate conductor layers and a corresponding one of the first to fourth semiconductor pillars is larger than a second gate capacitance between each of the third gate conductor layers or each of the fourth gate conductor layers and the corresponding one of the first to fourth semiconductor pillars (seventh aspect of the invention).

BRIEF DESCRIPTION OF DRAWINGS

FIGS. 2A, 2B and 2C are diagrams for describing an erase operation mechanism of the dynamic flash memory device according to the first embodiment.

FIGS. 4AA, 4AB and 4AC are diagrams for describing a read operation mechanism of the dynamic flash memory device according to the first embodiment.

FIGS. 5A, 5B, 5C and 5D are diagrams for describing a dynamic flash memory cell according to the first embodiment.

FIGS. 6A, 6B, 6C and 6D are diagrams for describing a dynamic flash memory cell according to a second embodiment.

FIGS. 7A, 7B, 7C and 7D are diagrams for describing a dynamic flash memory cell according to a third embodiment.

FIGS. 8A, 8B, 8C and 8D are diagrams for describing a dynamic flash memory cell according to a fourth embodiment.

FIGS. 11A, 11B and 11C are diagrams illustrating a read operation of the capacitorless DRAM memory cell of the related art.

DESCRIPTION OF EMBODIMENTS

Hereinafter, structures and operations of a semiconductor-element-including memory device (hereinafter, referred to as a dynamic flash memory) according to embodiments of the present invention will be described with reference to the drawings.

First Embodiment

A structure and an operation mechanism of a dynamic flash memory cell according to a first embodiment of the present invention will be described with reference to FIGS. 1 to 5D. The structure of a single dynamic flash memory cell will be described with reference to FIG. 1. A data erase mechanism will be described with reference to FIGS. 2A-2C. A data write mechanism will be described with reference to FIGS. 3A-3C. A data write mechanism will be described with reference to FIGS. 4AA-4AC and 4BA-4BD. A structure including four dynamic flash memory cells formed on the same substrate will be described with reference to FIGS. 5A-5D.

Figure 1:
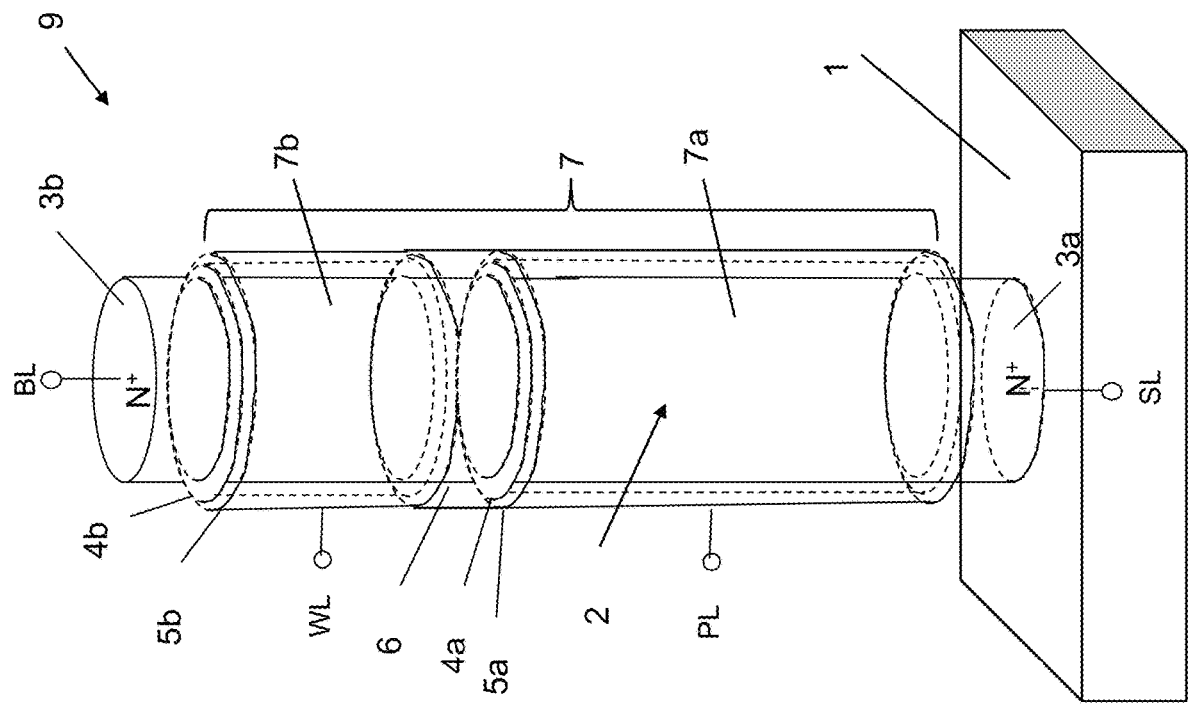
FIG. 1 is a structural diagram of a dynamic flash memory device according to a first embodiment.

FIG. 1 illustrates a structure of a dynamic flash memory cell according to a first embodiment of the present invention. On a substrate 1 (an example of a "substrate" in the claims), a silicon pillar 2 (an example of a "first semiconductor pillar" in the claims) (hereinafter, the silicon pillar is referred to as a "Si pillar") having a conductivity type of P-type or i-type (intrinsic type); an $N^+$ layer 3a (an example of a "first impurity layer" in the claims) connected to a bottom portion of the Si pillar 2; and an $N^+$ layer 3b (an example of a "second impurity layer" in the claims) connected to a top portion of the Si pillar 2 are formed. When one of the $N^+$ layer 3a and the $N^+$ layer 3b is a source, the other is a drain. A region of the Si pillar 2 between the $N^+$ layer 3a and the $N^+$ layer 3b is a channel region 7. A first gate insulating layer 4a (an example of a "first gate insulating layer" in the claims) surrounding a lower portion of the Si pillar 2 and a second gate insulating layer 4b (an example of a "second gate insulating layer" in the claims) surrounding an upper portion of the silicon pillar 2 are formed. The first gate insulating layer 4a and the second gate insulating layer 4b are in contact with or in the close vicinity of the $N^+$ layers 3a and 3b, one of which serves as the source and the other of which serves as the drain. A first gate conductor layer 5a (an example of a "first gate conductor layer" in the claims) surrounding the first gate insulating layer 4a and a second gate conductor layer 5b (an example of a "second gate conductor layer" in the claims) surrounding the second gate insulating layer 4b are formed. The first gate conductor layer 5a and the second gate conductor layer 5b are isolated from each other by an insulating layer 6 (an example of a "first insulating layer" in the claims). The channel region 7 is constituted by a first channel region 7a surrounded by the first gate insulating layer 4a and a second channel region 7b surrounded by the second gate insulating layer 4b. In this manner, a dynamic flash memory cell 9 made of the $N^+$ layers 3a and 3b serving as a source and a drain, the channel region 7, the first gate insulating layer 4a, the second gate insulating layer 4b, the first gate conductor layer 5a, and the second gate conductor layer 5b is formed. The $N^+$ layer 3a is connected to a source line SL (an example of a "source line" in claims). The $N^+$ layer 3b is connected to a bit line BL (an example of a "bit line" in claims). The first gate conductor layer 5a is connected to a plate line PL (an example of a "first drive control line" in claims). The second gate conductor layer 5b is connected to a word line WL (an example of a "word line" in claims). In the memory device, the plurality of dynamic flash memory cells described above are two-dimensionally arranged on the substrate 1.

The substrate 1 is a base material layer that is connected to the Si pillar 2 standing in the vertical direction and has an upper surface extending in the horizontal direction. Thus, a portion of the $N^+$ layer 3a located below the surface of the substrate 1 in the vertical direction is the substrate 1. The portion of the $N^+$ layer 3a inside the substrate 1 may extend in the horizontal direction. The substrate 1 may be composed of SOI (Silicon On Insulator) or may be composed of a single layer or a plurality of layers made of Si or another semiconductor material. The substrate 1 may be a well layer formed of one or more N layers or one or more P layers.

An erase operation mechanism will be described with reference to FIGS. 2A-2C. The channel region 7 between the N⁺ layers 3a and 3b is electrically isolated from the substrate 1 and serves as a floating body. FIG. 2A illustrates a state in which a group of positive holes 11 generated by impact ionization in the previous cycle is accumulated in the channel region 7 before an erase operation. As illustrated in FIG. 2B, at the time of the erase operation, the voltage of the source line SL is set to a negative voltage $V_{ERA}$. Here, $V_{ERA}$ is, for example, −3V. As a result, regardless of the value of the initial potential of the channel region 7, the PN junction between the N⁺ layer 3a which serves as the source and to which the source line SL is connected and the channel region 7 is forward biased. As a result, the group of positive holes 11 generated by impact ionization in the previous cycle and accumulated in the channel region 7 is drawn into the N⁺ layer 3a serving as a source portion, and the potential $V_{FB}$ of the channel region 7 becomes $V_{FB}=V_{ERA}+Vb$. Here, Vb represents a built-in voltage of the PN junction and is equal to about 0.7 V. Thus, in the case of $V_{ERA}=-3$ V, the potential of the channel region 7 is equal to −2.3 V. This value represents the potential state of the channel region 7 in an erase state. Thus, when the potential of the channel region 7 serving as the floating body becomes a negative voltage, a threshold voltage of an N-channel MOS transistor of the dynamic flash memory cell 9 increases due to a substrate bias effect. As a result, as illustrated in FIG. 2C, a threshold voltage of the second gate conductor layer 5b to which the word line WL is connected increases. This erase state of the channel region 7 corresponds to logical storage data "0". In data reading, the voltage applied to the first gate conductor layer 5a connected to the plate line PL is set to be higher than the threshold voltage at the time of logical storage data "1" and lower than the threshold voltage at the time of logical storage data "0". Consequently, the characteristic that no current flows even when the voltage of the word line WL is increased in reading of the logical storage data "0" is obtained as illustrated in FIG. 2C. The above-described voltage conditions applied to the bit line BL, the source line SL, the word line WL, and the plate line PL are an example for performing the erase operation, and may be other operation conditions under which the erase operation can be performed. For example, the erase operation may be performed by giving a voltage difference between the bit line BL and the source line SL.

Figure 3A:
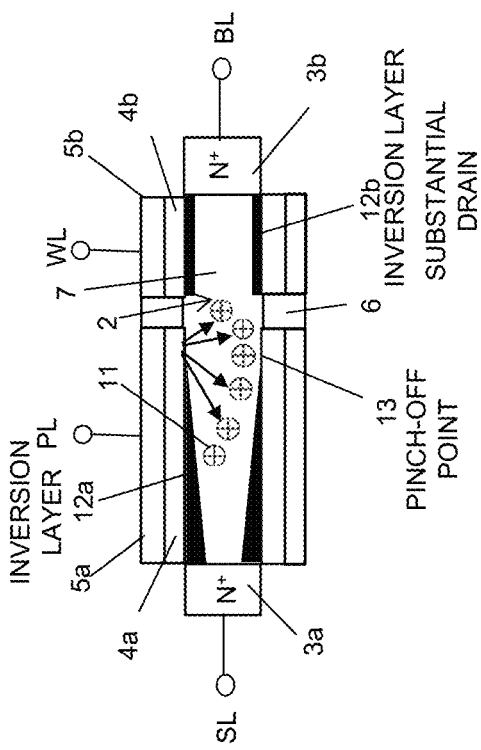
FIGS. 3A, 3B and 3C are diagrams for describing a write operation mechanism of the dynamic flash memory device according to the first embodiment.
Figure 3B:
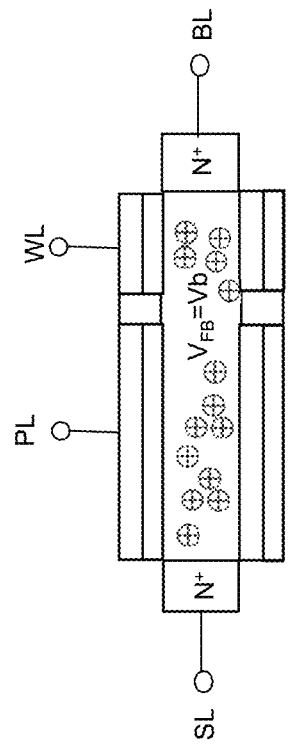
Figure 3C:
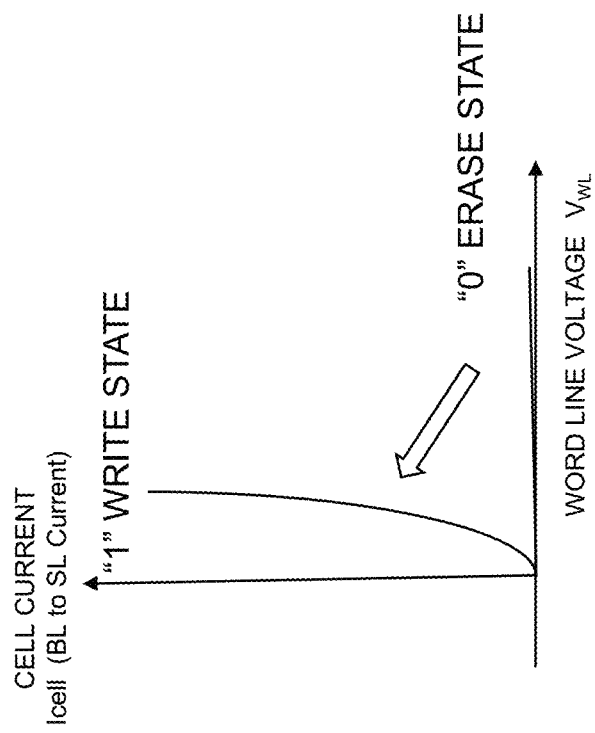

FIGS. 3A-3C illustrate a write operation of the dynamic flash memory cell according to the first embodiment of the present invention. As illustrated in FIG. 3A, for example, 0 V is input to the N⁺ layer 3a to which the source line SL is connected; for example, 3 V is input to the N⁺ layer 3b to which the bit line BL is connected; for example, 2 V is input to the first gate conductor layer 5a to which the plate line PL is connected; and, for example, 5 V is input to the second gate conductor layer 5b to which the word line WL is connected. As a result, as illustrated in FIG. 3A, an inversion layer 12a is formed on the inner side of the first gate conductor layer 5a to which the plate line PL is connected, and a first N-channel MOS transistor region made of the channel region 7a (see FIG. 1) surrounded by the first gate conductor layer 5a is operated in the saturated region. As a result, a pinch-off point 13 is present in the inversion layer 12a on the inner side of the first gate conductor layer 5a to which the plate line PL is connected. On the other hand, a second N-channel MOS transistor region made of the channel region 7b (see FIG. 1) surrounded by the second gate conductor layer 5b to which the word line WL is connected is operated in a linear region. As a result, no pinch-off point is present on the inner side of the second gate conductor layer 5b to which the word line WL is connected, and an inversion layer 12b is formed on the entire surface. This inversion layer 12b that is formed over the entire inner surface of the second gate conductor layer 5b to which the word line WL is connected substantially functions as the drain of the first N-channel MOS transistor region including the first gate conductor layer 5a. As a result, the electric field becomes maximum in a boundary region (a first boundary region) of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a region on the source side when viewed from the second N-channel MOS transistor region including the second gate conductor layer 5b to which the word line WL is connected. Thus, this phenomenon is referred to as a source-side impact ionization phenomenon. As a result of this source-side impact ionization phenomenon, electrons flow from the N⁺ layer 3a to which the source line SL is connected toward the N⁺ layer 3b to which the bit line is connected. The accelerated electrons collide with lattice Si atoms, and electron-positive hole pairs are generated by the kinetic energy of the collision. Some of the generated electrons flow into the first gate conductor layer 5a and the second gate conductor layer 5b, whereas most of the generated electrons flow into the N⁺ layer 3b to which the bit line BL is connected. In the writing of "1", electron-positive hole pairs may be generated using a gate-induced drain leakage (GIDL) current (see NPL 11), and the floating body FB may be filled with the generated group of positive holes.

As illustrated in FIG. 3B, the generated group of positive holes 11 is a majority carrier of the channel region 7 and charges the channel region 7 to a positive bias. Since the N⁺ layer 3a to which the source line SL is connected has 0 V, the channel region 7 is charged up to the built-in voltage Vb (about 0.7 V) of the PN junction between the N⁺ layer 3a to which the source line SL is connected and the channel region 7. When the channel region 7 is charged to a positive bias, the threshold voltage of the first N-channel MOS transistor region and the threshold voltage of the second N-channel MOS transistor region decrease due to the substrate bias effect. As a result, as illustrated in FIG. 3C, the threshold voltage of the N-channel MOS transistor in the second channel region 7b to which the word line WL is connected decreases. This write state of the channel region 7 is assigned to logical storage data "1".

At the time of the write operation, electron-positive hole pairs may be generated by an impact ionization phenomenon or a GIDL current in a second boundary region between the first impurity layer and a first channel semiconductor layer or in a third boundary region between the second impurity layer and a second channel semiconductor layer instead of the first boundary region, and the channel region 7 may be charged with the generated group of positive holes 11. The above-described voltage conditions applied to the bit line BL, the source line SL, the word line WL, and the plate line PL are an example for performing the write operation, and may be other operation conditions under which the write operation can be performed.

A read operation of the dynamic flash memory cell according to the first embodiment of the present invention and a memory cell structure related thereto will be described with reference to FIGS. 4AA-4AC and 4BA-4BD. The read operation of the dynamic flash memory cell will be described with reference to FIGS. 4AA to 4AC. As illustrated in FIG. 4AA, when the channel region 7 is charged up to the built-in voltage Vb (about 0.7 V), the threshold voltage of the N-channel MOS transistor decreases due to the substrate bias effect. This state is assigned to logical storage data "1". As illustrated in FIG. 4AB, when a memory block selected before writing is in an erase state "0" in advance, the floating voltage VFB of the channel region 7 is equal to $V_{ERA}$+Vb. The write state "1" is stored at random through the write operation. As a result, logical storage data of logical "0" and logical "1" is created for the word line WL. As illustrated in FIG. 4AC, reading is performed by a sense amplifier using a level difference between two threshold voltages for this word line WL. In data reading, the voltage applied to the first gate conductor layer 5a connected to the plate line PL is set to be higher than the threshold voltage at the time of logical storage data "1" and to be lower than the threshold voltage at the time of logical storage data "0". Consequently, a characteristic that no current flows even when the voltage of the word line WL is increased in reading of logical storage data "0" is obtained as illustrated in FIG. 4AC.

Figure 4B:
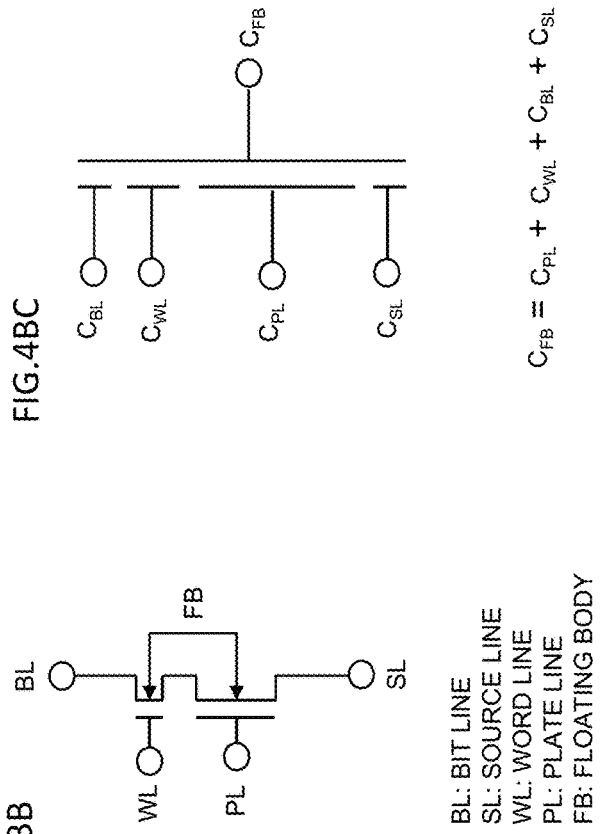
FIGS. 4BA, 4BB, 4BC and 4BD are diagrams for describing the read operation mechanism of the dynamic flash memory device according to the first embodiment.
Figure 4B:
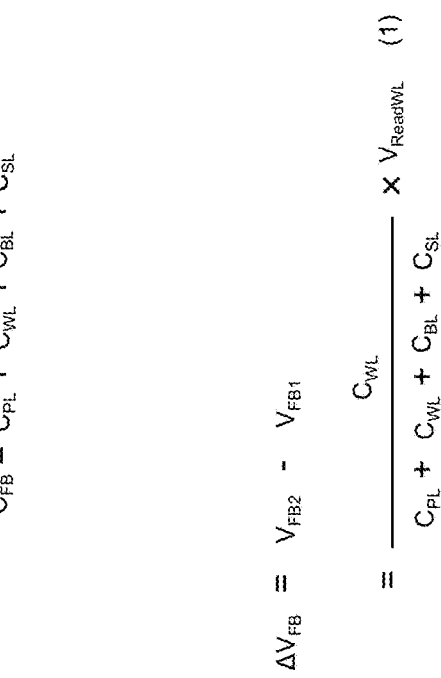
Figure 4B:
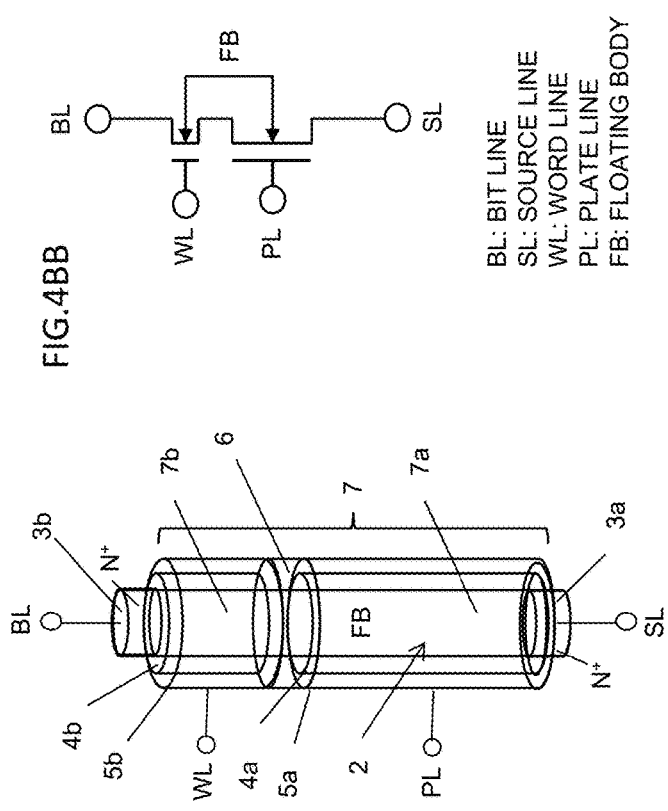
Figure 4B:
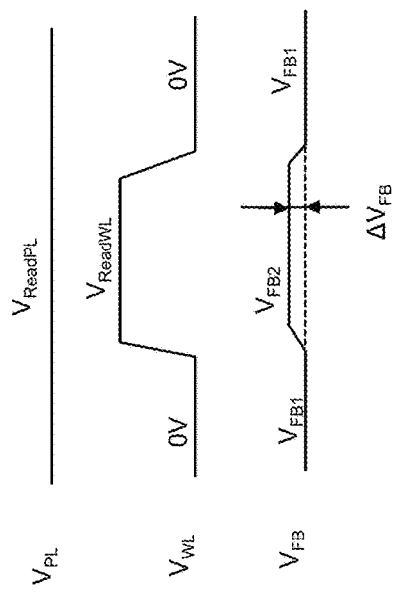
Figure 9B:
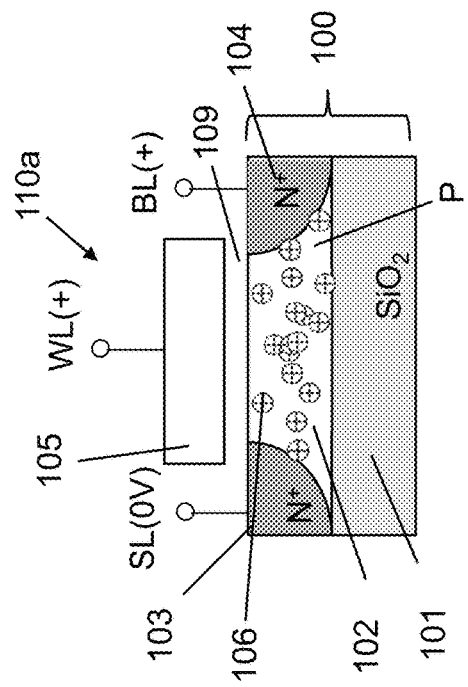
FIGS. 9A, 9B, 9C and 9D are diagrams for describing an issue in an operation of a capacitorless DRAM memory cell of the related art.
Figure 9A:
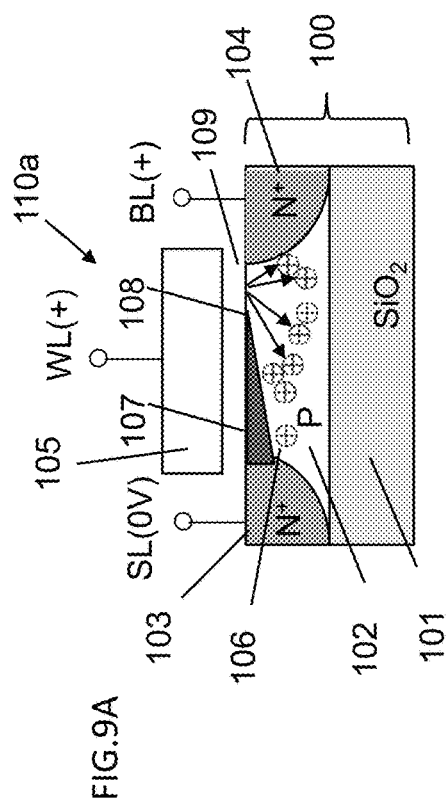
Figure 9D:
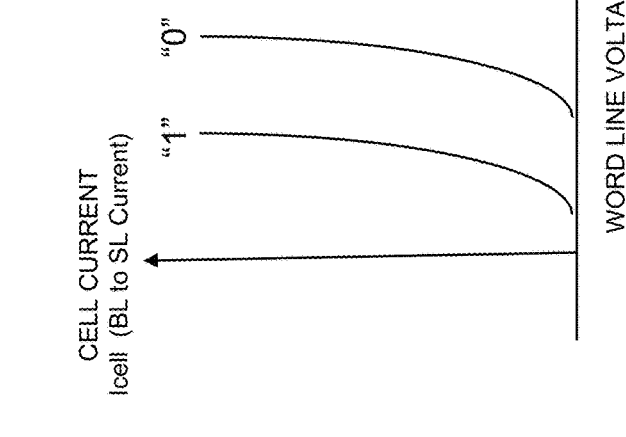
Figure 9C:
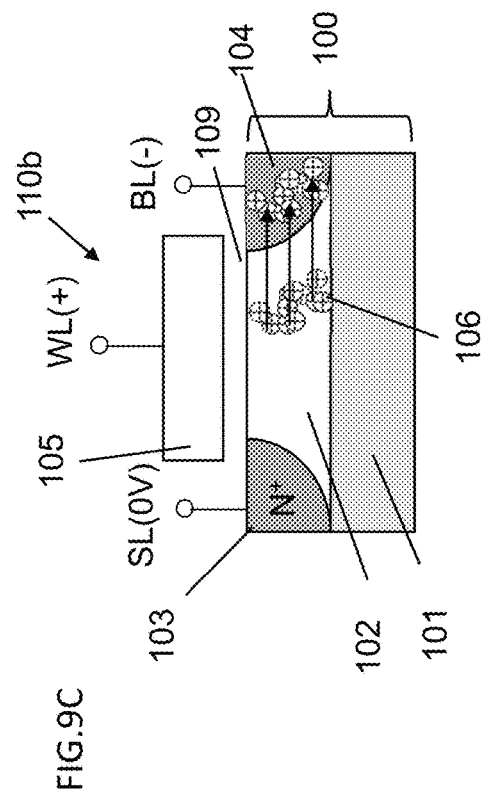
Figure 10B:
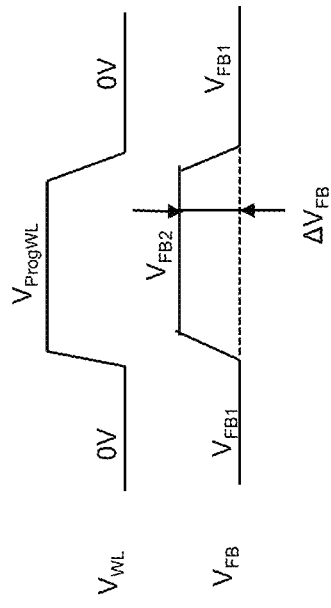
FIGS. 10A and 10B are diagrams for describing an issue in an operation of the capacitorless DRAM memory cell of the related art.
Figure 10A:
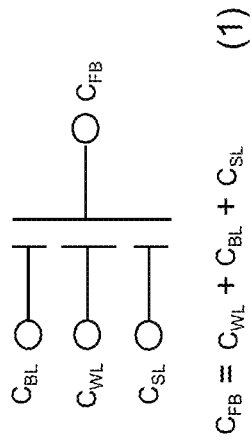

With reference to FIGS. 4BA-4BD, a magnitude relationship between two gate capacitances of the first gate conductor layer 5a and the second gate conductor layer 5b at the time of the read operation of the dynamic flash memory cell according to the first embodiment of the present invention and an operation related thereto will be described. The gate capacitance of the second gate conductor layer 5b to which the word line WL is connected is desirably designed to be smaller than the gate capacitance of the first gate conductor layer 5a to which the plate line PL is connected. As illustrated in FIG. 4BA, a vertical-direction length of the first gate conductor layer 5a to which the plate line PL is connected is set to be longer than a vertical-direction length of the second gate conductor layer 5b to which the word line WL is connected, to make the gate capacitance of the second gate conductor layer 5b to which the word line WL is connected smaller than the gate capacitance of the first gate conductor layer 5a to which the plate line PL is connected. FIG. 4BB illustrates an equivalent circuit of one cell of the dynamic flash memory illustrated in FIG. 4BA. FIG. 4BC illustrates a relationship among coupling capacitances of the dynamic flash memory. Here, $C_{WL}$ denotes the capacitance of the second gate conductor layer 5b, $C_{PL}$ denotes the capacitance of the first gate conductor layer 5a, $C_{BL}$ is the capacitance of the PN junction between the N$^+$ layer 3b serving as the drain and the second channel region 7b, and $C_{SL}$ denotes the capacitance of the PN junction between the N$^+$ layer 3a serving as the source and the first channel region 7a. As illustrated in FIG. 4BD, when the voltage applied to the word line WL fluctuates, the operation affects the channel region 7 as noise. The potential change $\Delta V_{FB}$ of the channel region 7 at this time is denoted by $$\Delta V_{FB} = C_{WL}/(C_{PL}+C_{WL}+C_{BL}+C_{SL}) \times V_{readWL} \quad (1).$$

Here, $V_{ReadWL}$ denotes a fluctuation potential of the word line WL at the time of reading. As is apparent from Equation (1), when the contribution ratio of $C_{WL}$ is made smaller relative to the total capacitance $C_{PL}+C_{WL}+C_{BL}+C_{SL}$ of the channel region 7, $\Delta V_{FB}$ decreases. $C_{BL}+C_{SL}$ denotes the capacitance of the PN junction. To increase $C_{BL}+C_{SL}$, for example, the diameter of the Si pillar 2 is increased. However, this is not desirable in terms of miniaturization of the memory cell. By contrast, by setting the vertical-direction length of the first gate conductor layer 5a to which the plate line PL is connected to be longer than the vertical-direction length of the second gate conductor layer 5b to which the word line WL is connected, $\Delta V_{FB}$ can be further decreased without decreasing the degree of integration of the memory cell in plan view. The above-described voltage conditions applied to the bit line BL, the source line SL, the word line WL, and the plate line PL are an example for performing the read operation, and may be other operation conditions under which the read operation can be performed.

FIGS. 5A-5D are structural diagrams of a memory device in which four dynamic flash memory cells of the present embodiment are formed on a substrate 20. FIG. 5A is a vertical cross-sectional view taken along line X-X' of FIG. 5B. FIG. 5B is a horizontal cross-sectional view taken along line A-A' of FIG. 5A. FIG. 5C is a horizontal cross-sectional view taken along line B-B' of FIG. 5A. FIG. 5D is a horizontal cross-sectional view taken along line C-C' of FIG. 5A. In an actual memory device, more than four dynamic flash memory cells are arranged in a matrix shape on the substrate 20.

As illustrated in FIGS. 5A-5D, an N$^+$ layer 21 (an example of a "first impurity layer" in claims) is on the substrate 20. On the N$^+$ layer 21, a Si pillar 22a (an example of a "first semiconductor pillar" in the claims), a Si pillar 22b (an example of a "second semiconductor pillar" in the claims), a Si pillar 22c (an example of a "third semiconductor pillar" in the claims), and a Si pillar 22d (an example of a "fourth semiconductor pillar" in the claims) stand. N$^+$ layers 29a, 29b, 29c (not illustrated), and 29d (not illustrated) (each of which is an example of a "second impurity layer" in the claims) are at the respective top portions of the Si pillars 22a, 22b, 22c, and 22d, respectively. A SiO$_2$ layer 24 is on the N$^+$ layer 21 and surrounds bottom portions of the Si pillars 22a to 22d. A HfO$_2$ layer 25a (an example of the "first gate insulating layer" in the claims) surrounds lower side surfaces of the Si pillars 22a to 22d. A TiN layer 26a (an example of a "first gate conductor layer" in the claims) surrounds the HfO$_2$ layer 25a on the side surfaces of the Si pillars 22a and 22b and is continuous in a line X-X' line direction. Likewise, a TiN layer 26b (an example of a "second gate conductor layer" in the claims) surrounds the HfO$_2$ layer 25a on the side surfaces of the Si pillars 22c and 22d, is continuous in a direction parallel to the line X-X', and is isolated from the TiN layer 26a. A HfO$_2$ layer 25b (an example of a "second gate insulating layer" in the claims) surrounds upper side surfaces of the Si pillars 22a to 22d and is continuous to the HfO$_2$ layer 25a. A TiN layer 28a (an example of a "third gate conductor layer" in the claims) surrounds the HfO$_2$ layer 25b on the side surfaces of the Si pillars 22a and 22b and is continuous in the X-X' line direction. Likewise, a TiN layer 28b (an example of a "fourth gate conductor layer" in the claims) surrounds the HfO$_2$ layer 25b on the side surfaces of the Si pillars 22c and 22d, is continuous in a direction parallel to the line X-X', and is isolated from the TiN layer 28a. The TiN layers 26a, 26b, 28a, and 28b are surrounded by a SiO$_2$ layer 30. The N$^+$ layers 29a to 29d are covered with a SiO$_2$ layer 33. The SiO$_2$ layer 33 on the N$^+$ layers 29a, 29b, 29c, and 29d has contact holes 31a, 31b, 31c, and 31d, respectively. A metal wiring layer 32a is connected to the N$^+$ layers 29a and 29c respectively through the contact holes 31a and 31c and extends in a direction orthogonal to the line X-X'. A metal wiring layer 32b is connected to the N$^+$ layers 29b and 29d respectively through the contact holes 31b and 31d and extends in a direction orthogonal to the line X-X'.

In FIGS. 5A-5D, the N+ layer 21 is connected to the source line SL described in FIG. 1. The TiN layers 26a and 26b are respectively connected to plate lines PL1 and PL2 which serve as the plate line PL described in FIG. 1. The TiN layers 28a and 28b are respectively connected to word lines WL1 and WL2 which serve as the word line WL described in FIG. 1. The metal wiring layers 32a and 32b are respectively connected to bit lines BL1 and BL2 which serve the bit line BL described in FIG. 1.

When the Si pillars 22a to 22d illustrated in FIG. 5B are formed sufficiently apart from each other, the TiN layers 26a and 26b surround the $HfO_2$ layer 25a on the side surfaces of the Si pillars 22a to 22d and have an equal width of a length Lg2 (an example of a "second length" in the claims) in plan view. The required film thickness of the TiN layers 26a and 26b is determined from a setting of the threshold voltage required for the operation of a MOS (Metal Oxide Semiconductor) transistor and the required processing margin. As illustrated in FIG. 5B, a distance Lg1 (an example of a "first length" in the claims) between two points at which the line X-X' intersects with outer periphery edges of the opposing $HfO_2$ layers 25a surrounding the respective Si pillars 22a and 22b is set to be less than twice Lg2 and larger than or equal to Lg2. A distance Lg3 (an example of a "third length" in the claims) between two points at which the line Y-Y' orthogonal to the line X-X' intersects with the outer periphery edges of the opposing $HfO_2$ layers 25a surrounding the respective Si pillars 22a and 22c is set to be larger than twice Lg2. Consequently, the TiN layer 26a that is continuous at the outer periphery portion of the Si pillars 22a and 22b in the X-X' line direction and the TiN layer 26b that is continuous at the outer periphery portion of the Si pillars 22c and 22d in the X-X' line direction are apart from each other. In this case, the TiN layer 26a on the outer periphery portion of the Si pillars 22a and 22b on the line X-X' serves as a common gate electrode layer for the two dynamic flash memory transistors formed on the Si pillars 22a and 22b. A relationship between the TiN layer 28a and the TiN layer 28b connected to the word line WL illustrated in FIG. 5C is set to be the same as the above-described relationship between the TiN layer 26a and the TiN layer 26b. Consequently, the TiN layer 28a that is continuous at the outer periphery portion of the Si pillars 22a and 22b in the X-X' line direction and the TiN layer 28b that is continuous at the outer periphery portion of the Si pillars 22c and 22d in the X-X' line direction are apart from each other. Note that the lengths of the TiN layers 26a and 26b and the TiN layers 28a and 28b may be different from each other while the relationships between Lg1, Lg2, and Lg3 are maintained. In plan view, the length Lg2 denotes a thicknesses of the TiN layers 26a and 26b in regions where the gate conductor layers of the Si pillars 22a, 22b, 22c, and 22d do not overlap each other.

Each of the TiN layers 26a and 26b, which serve as gate conductor layers, may be constituted by two or more layers of a TiN layer, a TaN layer, and a low-resistance doped poly-Si layer. In this case, if the threshold voltage of the MOS transistor is set only by the TiN layer, Lg1 can be reduced to the thickness of the TiN layer. In this case, the TaN layer, which is the TaN layer covering the side surface of the TiN layer in plan view, serves as a protective film for protecting the gate TiN layer in the RIE etching and the cleaning process. Similarly, each of the TiN layers 26a and 26b may be constituted by another conductor layer, which may be formed of a single layer or a plurality of layer, serving as a gate conductor layer. Each of the TiN layers 26a and 26b may be composed of a layer having a function of a gate conductor layer and a layer having a function of a protective film. Likewise, each of the TiN layers 28a and 28b serving as the gate conductor layers may be constituted by another conductor layer, which may be formed of a single layer or a plurality of layers, to include a protective conductor layer. Low-resistance doped poly-Si layers may be used instead of the TiN layers 26a and 26b. Alternatively, a TiN layer that is a thin gate conductor layer and, for example, a thick low-resistance doped poly-Si layer on the outer side of the TiN layer may be used. A $SiO_2$ layer formed by oxidizing the surface of the low-resistance doped poly-Si layer may be used as an insulating layer for electrically insulating the first gate conductor layer and the second gate conductor layer from each other.

In FIG. 1, the first gate conductor layer 5a is connected to the plate line PL, and the second gate conductor layer 5b is connected to the word line WL. By contrast, the first gate conductor layer 5a may be connected to the word line WL, and the second gate conductor layer 5b may be connected to the plate line PL. This configuration also provides a dynamic flash memory. Likewise, in FIGS. 5A-5D, the TiN layers 26a and 26b may be respectively connected to the word lines WL1 and WL2, and the TiN layers 28a and 28b may be respectively connected to the plate lines PL1 and PL2.

The present embodiment provides features below.

(Feature 1)

As illustrated in FIGS. 1 to 4BD, in the dynamic flash memory cell according to the first embodiment of the present invention, the voltage of the word line WL fluctuates up and down when the dynamic flash memory cell performs a write operation and a read operation. At this time, the plate line PL functions to reduce the capacitive coupling ratio between the word line WL and the channel region 7. As a result, the influence of the voltage change on the channel region 7 caused when the voltage of the word line WL fluctuates up and down can be markedly suppressed. Thus, the difference between the threshold voltages of the SGT transistor for the word line WL that indicates logical "0" and logical "1" can be increased. This leads to an increase in the operation margin of the dynamic flash memory cell.

(Feature 2)

As described with reference to FIGS. 5A-5D, the region of the TiN layer 26a on the line X-X' can be used as a common gate conductor layer of the transistors of two dynamic flash memory cells formed on the Si pillar 22a and the Si pillar 22b. Thus, the thicknesses Lg1 of the TiN layer 26a on the line X-X' can be reduced to Lg2. This indicates that the dimension of the dynamic flash memory cell in the X-X' line direction can be reduced. The same applies to the TiN layer 26b connected to the plate line PL2 and the TiN layers 28a and 28b respectively connected to the word lines WL1 and WL2. This enables a higher degree of integration of the dynamic flash memory. In addition, since the diameters of the Si pillars 22a to 22d can be increased even with the same cell length, the floating body can have a large volume and accumulate a group of many positive holes. As a result, the operation margin is increased.

(Feature 3)

As described with reference to FIGS. 5A-5D, the distance Lg3 between two points at which the line Y-Y' orthogonal to the line X-X' intersects with the outer periphery edges of the opposing $HfO_2$ layers 25a surrounding the Si pillars 22a and 22c is set to be larger than twice Lg2. As a result, the TiN layer 26a that is continuous at the outer periphery portion of the Si pillars 22a and 22b in the X-X' line direction and the TiN layer 26b that is continuous at the outer periphery portion of the Si pillars 22c and 22d in the X-X' line direction are apart from each other, and the plate lines PL1 and PL2 are electrically isolated from each other. Thus, an operation mode of independently driving the plate lines PL1 and PL2 can be applied to the dynamic flash memory. Likewise, the TiN layers 28a and 28b respectively connected to the word lines WL1 and WL2 that are independent from each other can be apart from each other.

Second Embodiment

FIGS. 6A-6D are structural diagrams of a memory device in which four dynamic flash memory cells of a second embodiment are formed on a substrate 20. In FIGS. 6A-6D, the same reference signs are given to the same or similar components as those of the embodiment already described. FIG. 6A is a vertical cross-sectional view taken along line X-X' of FIG. 6B. FIG. 6B is a horizontal cross-sectional view taken along line A-A' of FIG. 6A. FIG. 6C is a horizontal cross-sectional view taken along line B-B' of FIG. 6A. FIG. 6D is a horizontal cross-sectional view taken along line C-C' of FIG. 6A. In an actual memory device, more than four dynamic flash memory cells are arranged in a matrix shape.

As illustrated in FIGS. 6A-6D, an $N^+$ layer 21 is on the substrate 20. First Si pillars 22aa, 22ba, 22ca, and 22da stand on the $N^+$ layer 21. Second Si pillars 22ab, 22bb, 22cb, and 22db stand on the first Si pillars 22aa, 22ba, 22ca, and 22da, respectively. In plan view, the outer periphery edges of the second Si pillars 22ab to 22db are on the inner side than the outer periphery edges of the first Si pillars 22aa to 22da, respectively. A $SiO_2$ layer 24, an $HfO_2$ layer 25a, and TiN layers 26a and 26b surrounding the first Si pillars 22aa to 22da are configured in the same manner as the corresponding portions in FIGS. 5A-5D. The TiN layer 26a surrounds the $HfO_2$ layer 25a on the side surfaces of the first Si pillars 22aa and 22ba and is continuous in the X-X' line direction. Likewise, the TiN layer 26b surrounds the $HfO_2$ layer 25a on the side surfaces of the first Si pillars 22ca and 22da, is continuous in a direction parallel to the line X-X', and is isolated from the TiN layer 26a. $N^+$ layers 35a, 35b, 35c (not illustrated), and 35d (not illustrated) are at the respective top portions of the second Si pillars 22ab, 22bb, 22cb, and 22db, respectively.

A $HfO_2$ layer 25c surrounds the side surfaces of the second Si pillars 22ab to 22db and is connected to the $HfO_2$ layer 25a. A TiN layer 34a surrounds the $HfO_2$ layer 25c on the side surfaces of the second Si pillars 22ab and 22bb and is continuous in the X-X' line direction. Likewise, a TiN layer 34b surrounds the $HfO_2$ layer 25c on the side surfaces of the second Si pillars 22cb and 22db, is continuous in a direction parallel to the line X-X', and is isolated from the TiN layer 34a. A length Lg5 (an example of a "fifth length" in the claims) between two points which face each other and at which the line Y-Y' intersects with the outer periphery edges of the TiN layers 26a and 26b is smaller than a length Lg4 (an example of a "fourth length" in the claims) between the TiN layers 34a and 34b. The TiN layers 26a, 26b, 34a, and 34b are surrounded by a $SiO_2$ layer 30. The $N^+$ layers 35a to 35d are covered with a $SiO_2$ layer 33. The $SiO_2$ layer 33 on the $N^+$ layers 35a, 35b, 35c, and 35d has contact holes 37a, 37b, 37c, and 37d, respectively. A metal wiring layer 32a is connected to the $N^+$ layers 35a and 35c respectively through the contact holes 37a and 37c and extends in a direction orthogonal to the line X-X'. A metal wiring layer 32b is connected to the $N^+$ layers 35b and 35d respectively through the contact holes 37b and 37d and extends in a direction orthogonal to the line X-X'.

In FIGS. 6A-6D, the $N^+$ layer 21 is connected to the source line SL described in FIG. 1. The TiN layers 26a and 26b are respectively connected to plate lines PL1 and PL2 which serve as the plate line PL described in FIG. 1. The TiN layers 34a and 34b are respectively connected to word lines WL1 and WL2 which serve as the word line WL described in FIG. 1. The metal wiring layers 32a and 32b are respectively connected to bit lines BL1 and BL2 which serve the bit line BL described in FIG. 1.

As illustrated in FIG. 6C, since the second Si pillars 22ab, 22bb, 22cb, and 22db have a smaller diameter than the first Si pillars 22aa, 22ba, 22ca, and 22da, the distance Lg4 between the TiN layers 34a and 34b respectively connected to the word lines WL1 and WL2 is larger than the distance (=Lg3−2Lg2) between the TiN layers 28a and 28b illustrated in FIG. 5C.

The present embodiment provides features below.
(Feature 1)

In the present embodiment, the structure formed by the first Si pillars 22aa to 22da, and the $SiO_2$ layer 24, the $HfO_2$ layer 25a, and the TiN layers 26a and 26b surrounding the first Si pillars 22aa to 22da is the same as that illustrated in FIGS. 5A-5D. Thus, the TiN layer 26a connected to the line PL1 on the line X-X' can be used as a common gate conductor layer of the transistors of two dynamic flash memory cells formed on the first Si pillar 22aa and the first Si pillar 22ba. Thus, the thicknesses Lg1 of the TiN layer 26a on the line X-X' can be reduced to Lg2. Likewise, the TiN layer 26b connected to the line PL2 on the line parallel to the line X-X' serves as a common gate conductor layer of the transistors of the two dynamic flash memory cells formed on the first Si pillar 22ca and the first Si pillar 22da, and the thickness of the TiN layer 26b can be reduced to Lg2. Thus, the dimension of the dynamic flash memory cell in the X-X' line direction can be reduced, and a higher degree of integration of the dynamic flash memory can be implemented.
(Feature 2)

In the present embodiment, the outer periphery edges of the second Si pillars 22ab to 22db in plan view are on inner sides of the outer periphery edges of the first Si pillars 22aa to 22da, respectively. Thus, the distance Lg4 between the TiN layers 34a and 34b respectively connected to the word lines WL1 and WL2 can be made larger than the distance Lg5 between the outer periphery edges of the TiN layers 28a and 28b that intersect with the line Y-Y'. Thus, the capacitance on the word line WL1 (capacitance between the TiN layers 34a and 34b) can be made smaller than the capacitance on the word line WL1 (capacitance between the TiN layers 28a and 28b) illustrated in FIGS. 5A-5D. Since the distance between the TiN layers 34a and 34b can be increased, it becomes easier to form, for example, air gaps between the TiN layers 34a and 34b for further reducing the capacitance between the word lines WL1 and WL2. This enables an increased operation margin of the dynamic flash memory.

Third Embodiment

FIGS. 7A-7D is a structural diagram of a memory device in which four dynamic flash memory cells of a third embodiment are formed on a substrate 20. In FIGS. 7A-7D, the same reference signs are given to the same or similar components as those of the embodiments already described. FIG. 7A is a vertical cross-sectional view taken along line X-X' of FIG. 7B. FIG. 7B is a horizontal cross-sectional view taken along line A-A' of FIG. 7A. FIG. 7C is a horizontal cross-sectional view taken along line B-B' of FIG. 7A. FIG. 7D is a horizontal cross-sectional view taken along line C-C' of FIG. 7A. In an actual memory device, more than four dynamic flash memory cells are arranged in a matrix shape.

As illustrated in FIGS. 7A-7D, an N$^+$ layer 21 is on the substrate 20. On the N$^+$ layer 21, first Si pillars 22aa and 22ab stand at the same positions as in FIGS. 6A-6D and first Si pillars 22cA and 22dA stand at positions to which the first Si pillars 22ca and 22da in FIGS. 6A-6D are translated upward along the line Y-Y'. Second Si pillars 22ab, 22bb, 22cB, and 22dB are on the first Si pillars 22aa, 22ba, 22cA, and 22dA, respectively. In plan view, the outer periphery edges of the second Si pillars 22ab to 22dB are on the inner side than the outer periphery edges of the first Si pillars 22aa to 22dA, respectively. Bottom portions of the first Si pillars 22aa to 22dA are surrounded by a SiO$_2$ layer 24. Lower side portions of the first Si pillars 22aa to 22dA are surrounded by a HfO$_2$ layer 25a. A TiN layer 26A surrounds the HfO$_2$ layer 25a, is continuous between the first Si pillars 22aa and 22dA, and is connected to a plate line PL. N$^+$ layers 35a, 35b, 35c (not illustrated), and 35d (not illustrated) are at the respective top portions of the second Si pillars 22ab, 22bb, 22cB, and 22dB, respectively. A HfO$_2$ layer 25c surrounds the side surfaces of the second Si pillars 22ab to 22dB and is connected to the HfO$_2$ layer 25a. A TiN layer 34a surrounds the HfO$_2$ layer 25c on the side surfaces of the second Si pillars 22ab and 22bB and is continuous in the X-X' line direction. Likewise, a TiN layer 34B surrounds the HfO$_2$ layer 25c on the side surfaces of the second Si pillars 22cB and 22dB, is continuous in a direction of a line parallel to the line X-X', and is isolated from the TiN layer 34a. The TiN layers 26A, 34a, and 34B are surrounded by a SiO$_2$ layer 30. The N$^+$ layers 35a to 35d are covered with a SiO$_2$ layer 33. The SiO$_2$ layer 33 on the N$^+$ layers 35a, 35b, 35c, and 35d has contact holes 37a, 37b, 37C, and 37D, respectively. A metal wiring layer 32a is connected to the N$^+$ layers 35a and 35c respectively through the contact holes 37a and 37C and extends in a direction orthogonal to the line X-X'. A metal wiring layer 32b is connected to the N$^+$ layers 35b and 35d respectively through the contact holes 37b and 37D and extends in a direction orthogonal to the line X-X'.

In FIGS. 7A-7D, the TiN layer 26A connected to the plate line PL is continuous between the first Si pillars 22aa to 22dA. The TiN layers 34a and 34b are respectively connected to the word lines WL1 and WL2 that serve as the word line WL described in FIG. 1, and are isolated from each other. The metal wiring layers 32a and 32b are respectively connected to the bit lines BL1 and BL2 which serve as the bit line BL described in FIG. 1.

In FIGS. 7A-7D, a thicknesses Lg2 is a thicknesses of the TiN layer 26A in a portion that is in contact with none of the adjacent first Si pillars 22aa to 22dA in plan view. The distance Lg1 between two points at which the line X-X' intersects with the outer periphery edges of the opposing HfO$_2$ layers 25a surrounding the respective first Si pillars 22aa and 22ab is less than twice Lg2 and larger than or equal to Lg2. Likewise, a distance Lg6 between two points at which the line Y-Y' intersects with the outer periphery edges of the opposing HfO$_2$ layers 25a surrounding the respective first Si pillars 22aa and 22cA is less than twice Lg2 and larger than or equal to Lg2. Thus, the TiN layer 26A is continuous between the first Si pillars 22aa and 22dA. The outer periphery edges of the second Si pillars 22ab to 22dB are on the inner side than those of the first Si pillars 22aa to 22dA in plan view, so that the TiN layers 34a are 34B respectively connected to the word lines WL1 and WL2 isolated from each other are formed.

The present embodiment provides a feature below.

In the present embodiment, as compared with FIGS. 6A-6D, the distances between the Si pillars 22aa and 22cA and between the Si pillars 22ab and 22dA can be reduced not only in the X-X' line direction but also in the Y-Y' line direction. This enables a much higher degree of integration of the dynamic flash memory cell.

Fourth Embodiment

FIGS. 8A-8D are structural diagrams of a memory device in which four dynamic flash memory cells of a fourth embodiment are formed on a substrate 20. In FIGS. 8A-8D, the same reference signs are given to the same or similar components as those of the embodiments already described. FIG. 8A is a vertical cross-sectional view taken along line X-X' of FIG. 8B. FIG. 8B is a horizontal cross-sectional view taken along line A-A' of FIG. 8A. FIG. 8C is a horizontal cross-sectional view taken along line B-B' of FIG. 8A. FIG. 8D is a horizontal cross-sectional view taken along line C-C' of FIG. 8A. In an actual memory device, more than four dynamic flash memory cells are arranged in a matrix shape.

In plan view, the SiO$_2$ layer 30 is present between the TiN layers 26A in FIGS. 7A-7D. By contrast, for example, a tungsten (W) layer 40 is formed instead of the SiO$_2$ layer 30 as illustrated in FIG. 8B. The upper surface position of the W layer 40 is the same as the upper surface position of the TiN layer 26a, and a SiO$_2$ layer 30a is formed between the TiN layers 34a and 34B. The rest is the same as that of the third embodiment.

The present embodiment provides a feature below.

In the present embodiment, as in the third embodiment, the distances between the first Si pillars 22aa and 22cA and between the first Si pillars 22ab and 22dA can be reduced not only in the X-X' line direction but also in the Y-Y' line direction. Further, by providing the W layer 40 between the TiN layers 26A, the degree of integration of the dynamic flash memory cell can be increased and the resistance of the plate line PL can be reduced.

Other Embodiments

The Si pillar 2 is formed in FIG. 1 in the first embodiment. Alternatively, a semiconductor pillar made of a semiconductor material other than Si may be used. This also applies to the other embodiments according to the present invention. In FIGS. 6A-6D, the first Si pillars 22aa to 22ad and the second Si pillars 22ab to 22db are made of the same semiconducting material, but may be made of different semiconducting materials. This also applies to the other embodiments according to the present invention.

The horizontal cross-sectional shape of the Si pillars 22a to 22d in FIGS. 5A-5D may be circular, elliptical, or rectangular if the relationships between Lg1, Lg2, and Lg3 described in the present embodiments can be maintained. This also applies to the other embodiments according to the present invention.

The N$^+$ layers 3a and 3b in FIG. 1 may be composed of a Si layer containing a donor impurity or another semiconductor material layer. The N$^+$ layers 3a and 3b may also be composed of different semiconductor material layers. As for the formation methods, the N$^+$ layers may be formed using an epitaxial crystal growth method or another method. This also applies to the other embodiments according to the present invention.

In FIGS. 5A-5D, the TiN layers 26a and 26b are used as the gate conductor layers respectively connected to the plate lines PL1 and PL2. Alternatively, a single conductor material layer or a combination of a plurality of conductor material layers may be used instead of the TiN layers 26a and 26b. Likewise, the TiN layers 28a and 28b respectively connected to the word lines WL1 and WL2 are used. Alternatively, a single conductor material layer or a combination of a plurality of conductor material layers may be used instead of the TiN layers 28a and 28b. The outer sides of the gate TiN layers 16 and 19a may be connected to each other by a wiring metal layer of W or the like, for example. This also applies to the other embodiments according to the present invention.

In FIGS. 6A-6D, the description is given using the first Si pillars 22aa to 22da and the second Si pillars 22ab to 22db each having a rectangular vertical cross-section. However, the first Si pillars 22aa to 22da and the second Si pillars 22ab to 22db may have a trapezoidal vertical cross-section. Alternatively, the vertical cross-sections of the first Si pillars 22aa to 22da and the vertical cross-sections of the second Si pillars 22ab to 22db may be different from each other to have a rectangular shape and a trapezoidal shape. The same applies to the other embodiments according to the present invention.

Each of the HfO$_2$ layers 25a and 25b described with reference to FIGS. 5A-5D may be another insulating layer formed of a single layer or a plurality of layers as long as the layer functions as a gate insulating layer. The HfO$_2$ layers 25a and 25b may be composed of material layers of different materials or material layers having different physical values such as thicknesses. This also applies to the other embodiments according to the present invention.

In FIGS. 5A-5D, to decrease the resistance of the source line SL, for example, a wiring conductor layer such as a W layer may be formed to be connected to the N$^+$ layer 21 at the bottom portions of the Si pillars 22a to 22d. The W layer may be formed at intervals of a plurality of Si pillars. In FIGS. 5A-5D, the N$^+$ layer 21 is continuous at the bottom portions of the Si pillars 22a to 22d. Alternatively, a metal layer or an alloyed layer may be disposed between the bottom portions of the Si pillars 22a to 22d. This also applies to the other embodiments according to the present invention.

In FIG. 1, the gate length of the first gate conductor layer 5a is made longer than the gate length of the second gate conductor layer 5b so that the gate capacitance of the first gate conductor layer 5a connected to the plate line PL is larger than the gate capacitance of the second gate conductor layer 5b connected to the word line WL. In this way, the gate capacitance of the first gate conductor layer 5a can be made larger than the gate capacitance of the second gate conductor layer 5b further. In addition, even in a structure in which the gate length of the first gate conductor layer 5a is longer than the gate length of the second gate conductor layer 5b or is not longer than the gate length of the second gate conductor layer 5b, the gate capacitance of the first gate conductor layer 5a can be made larger than the gate capacitance of the second gate conductor layer 5b further by making the thicknesses of the gate insulating layers different to make the thickness of the first gate insulating layer 4a thinner than the thickness of the second gate insulating layer 4b. The dielectric constant of the first gate insulating layer 4a may be made higher than the dielectric constant of the second gate insulating layer 4b by changing the dielectric constants of the materials of the respective gate insulating layers. The gate capacitance of the first gate conductor layer 5a may be made larger than the gate capacitance of the second gate conductor layer 5b further by any combination of the lengths of the gate conductor layers 5a and 5b, the thicknesses of the gate insulating layers 4a and 4b, and the dielectric constants. This also applies to the other embodiments according to the present invention.

In FIGS. 5A-5D, the N$^+$ layer 21 is continuous at the bottom portions of the Si pillars 22a to 22d. Alternatively, in plan view, in the X-X' line direction orthogonal to the Y-Y' line direction in which the Si pillars 22a and 22c connected to the bit line BL1 are adjacent to each other and the Si pillars 22b and 22d connected to the bit line BL2 are adjacent to each other, the bottom portions of the Si pillars 22a and 22b are connected to each other and the bottom portions of the Si pillars 22c and 22d are connected to each other, and the bottom portions of the Si pillars 22a and 22b are electrically isolated from the bottom portions of the Si pillars 22c and 22d. This isolation is performed using, for example, STI (Shallow Trench Isolation), a well structure, an SOI structure, or the like. As a result, the source line connected to the N$^+$ layer at the bottom portions of the Si pillars 22a and 22b and the source line connected to the N$^+$ layer at the bottom portions of the Si pillars 22c and 22d can be driven independently. In this case, a conductor layer made of a metal, alloy, or the like is desirably disposed adjacently to the isolated N$^+$ layers. This also applies to the other embodiments according to the present invention.

Various embodiments and modifications can be made to the present invention without departing from the broad spirit and scope of the present invention. The embodiments described above are for describing an example of the present invention, and do not limit the scope of the present invention. The embodiments and modifications described above can be combined as desired. Even if some of the components of the above-described embodiment is omitted as necessary, such a configuration is also within the scope of the technical idea of the present invention.

INDUSTRIAL APPLICABILITY

A memory device using a pillar-shaped semiconductor element according to the present invention can implement a high-density and high-performance memory device including dynamic flash memory elements.

The invention claimed is:
1. A memory device using a pillar-shaped semiconductor element, comprising:
  a first semiconductor pillar, a second semiconductor pillar, a third semiconductor pillar, and a fourth semiconductor pillar, the first semiconductor pillar and the second semiconductor pillar standing on a substrate in a vertical direction, having respective center points on a first line in plan view, and being adjacent to each other, the third semiconductor pillar and the fourth semiconductor pillar standing on the substrate in the vertical direction, having respective center points on a second line parallel to the first line in plan view, and being adjacent to each other;
  a first impurity region connected to bottom portions of the first to fourth semiconductor pillars;
  first gate insulating layers located above the first impurity region in the vertical direction and each surrounding a lower portion of a corresponding one of the first to fourth semiconductor pillars;

first gate conductor layers and second gate conductor layers surrounding the respective first gate insulating layers, the first gate conductor layers being continuous around the first semiconductor pillar and the second semiconductor pillar, the second gate conductor layers being continuous around the third semiconductor pillar and the fourth semiconductor pillar;

second gate insulating layers located above the respective first gate insulating layers and each surrounding a side surface of a corresponding one of the first to fourth semiconductor pillars;

third gate conductor layers and fourth gate conductor layers surrounding the respective second gate insulating layers, each having an upper surface located below top portions of the first to fourth semiconductor pillars in the vertical direction, and each being apart from the first gate conductor layers and the second gate conductor layers in the vertical direction, the third gate conductor layers being continuous around the first semiconductor pillar and the second semiconductor pillar, the fourth gate conductor layers being continuous around the third semiconductor pillar and the fourth semiconductor pillar;

second impurity regions at the respective top portions of the first to fourth semiconductor pillars;

a first wiring conductor layer connected to the second impurity regions at the respective top portions of the first semiconductor pillar and the third semiconductor pillar; and a second wiring conductor layer connected to the second impurity regions at the respective top portions of the second semiconductor pillar and the fourth semiconductor pillar, wherein the first gate conductor layer of the first semiconductor pillar and the first gate conductor layer of the second semiconductor pillar are in contact with each other, and the first gate conductor layer of the third semiconductor pillar and the first gate conductor layer of the fourth semiconductor pillar are in contact with each other, in plan view, a first length between two opposing intersections among intersections between the first line and two outer periphery edges of the first gate insulating layers surrounding the first semiconductor pillar and the second semiconductor pillar is smaller than twice a second length that is a thickness of a portion of each of the first gate conductor layers that is not in contact with the other first gate conductor layers, and voltages to be applied to the first gate conductor layers, the second gate conductor layers, the third gate conductor layers, the fourth gate conductor layers, the first impurity region, and the second impurity region regions are controlled to perform a data write operation, a data erase operation, and a data read operation.

2. The memory device using a pillar-shaped semiconductor element, according to claim 1, wherein in plan view, a third length between two opposing intersections among intersections between two outer periphery edges of the first gate insulating layers surrounding the first semiconductor pillar and the third semiconductor pillar and a third line that is orthogonal to the first line and passes through the center points of the first semiconductor pillar and the third semiconductor pillar is larger than twice the second length.

3. The memory device using a pillar-shaped semiconductor element, according to claim 1, wherein in plan view, a third length between two opposing intersections among intersections between two outer periphery edges of the first gate insulating layers surrounding the first semiconductor pillar and the third semiconductor pillar and a third line that is orthogonal to the first line and passes through the center points of the first semiconductor pillar and the third semiconductor pillar is smaller than twice the second length.

4. The memory device using a pillar-shaped semiconductor element, according to claim 1, wherein in plan view, a first outer periphery edge of a portion of each of the first to fourth semiconductor pillars surrounded by the respective second gate insulating layers is on inner side of a second outer periphery edge of a portion of a corresponding one of the first to fourth semiconductor pillars surrounded by the respective first gate insulating layers, and in plan view, a fourth length between the third gate conductor layers surrounding the first semiconductor pillar and the second semiconductor pillar and the respective fourth gate conductor layers surrounding the third semiconductor pillar and the fourth semiconductor pillar is larger than a fifth length between the first gate conductor layers surrounding the first semiconductor pillar and the third semiconductor pillar and the respective second gate conductor layers.

5. The memory device using a pillar-shaped semiconductor element, according to claim 1, further comprising:

a first conductor layer formed of a single layer or a plurality of layers and covering an outer surface of the first gate conductor layers in plan view.

6. The memory device using a pillar-shaped semiconductor element, according to claim 1, wherein the voltages to be applied to the first gate conductor layers, the second gate conductor layers, the third gate conductor layers, the fourth gate conductor layers, the first impurity region, and the second impurity region regions are controlled to perform the data write operation for holding a group of positive holes generated by an impact ionization phenomenon or a gate-induced drain leakage current in any or all of the first to fourth semiconductor pillars, and the voltages to be applied to the first gate conductor layers, the second gate conductor layers, the third gate conductor layers, the fourth gate conductor layers, the first impurity region, and the second impurity region regions are controlled to perform the data erase operation for discharging the group of positive holes from inside of any or all of the first to fourth semiconductor pillars.

7. The memory device using a pillar-shaped semiconductor element, according to claim 1, wherein a first gate capacitance between each of the first gate conductor layers or each of the second gate conductor layers and a corresponding one of the first to fourth semiconductor pillars is larger than a second gate capacitance between each of the third gate conductor layers or each of the fourth gate conductor layers and the corresponding one of the first to fourth semiconductor pillars.

* * * * *